(12) United States Patent
Tomita et al.

(10) Patent No.: US 7,446,549 B2
(45) Date of Patent: Nov. 4, 2008

(54) SEMICONDUCTOR LEAKAGE CURRENT DETECTOR AND LEAKAGE CURRENT MEASUREMENT METHOD, SEMICONDUCTOR LEAKAGE CURRENT DETECTOR WITH VOLTAGE TRIMMING FUNCTION AND REFERENCE VOLTAGE TRIMMING METHOD, AND SEMICONDUCTOR INTEGRATED CIRCUIT THEREOF

(75) Inventors: Yasuhiro Tomita, Osaka (JP); Manabu Komiya, Kyoto (JP); Hitoshi Suwa, Osaka (JP); Toshiki Mori, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/614,127

(22) Filed: Dec. 21, 2006

(65) Prior Publication Data

US 2007/0145981 A1    Jun. 28, 2007

(30) Foreign Application Priority Data

Dec. 22, 2005   (JP) .............................. 2005-370915

(51) Int. Cl.
  *G01R 31/02*   (2006.01)
  *G01R 19/14*   (2006.01)
  *G01R 31/08*   (2006.01)
  *H03K 5/22*    (2006.01)
  *G08B 21/00*   (2006.01)

(52) U.S. Cl. ...................... 324/763; 324/133; 324/522; 327/63; 327/82; 340/644

(58) Field of Classification Search ................. 324/133, 324/522, 763; 327/63, 82; 340/644
See application file for complete search history.

(56) References Cited

U.S. PATENT DOCUMENTS

| 5,410,511 A | | 4/1995 | Michiyama |
| 5,774,404 A | * | 6/1998 | Eto .............................. 365/222 |
| 5,986,940 A | | 11/1999 | Atsumi et al. |
| 6,052,307 A | * | 4/2000 | Huber et al. ........... 365/185.21 |

(Continued)

FOREIGN PATENT DOCUMENTS

| JP | 61137075 A | * | 6/1986 |
| JP | 6-251593 | | 9/1994 |

OTHER PUBLICATIONS

English Language Abstract of JP 6-251593.

*Primary Examiner*—Ha Tran T Nguyen
*Assistant Examiner*—Karen M Kusumakar
(74) *Attorney, Agent, or Firm*—Greenblum & Bernstein, P.L.C.

(57) ABSTRACT

A semiconductor leakage current detector of the present invention includes a first analog switch which causes a current to be measured to flow or to be cut off, a second analog switch which causes a reference current to flow or to be cut off, an integral capacitance element which is connected by the first analog switch and the second analog switch and is charged with the current to be measured or the reference current, a discharge unit which discharges the integral capacitor, and a comparison unit which compares the reference voltage with each of an integral voltage generated in the integral capacitor by a reference current after the discharge of the integral capacitor and an integral voltage generated in the integral capacitance element by the current to be measured after the discharge of the integral capacitor.

41 Claims, 28 Drawing Sheets

U.S. PATENT DOCUMENTS

| | | |
|---|---|---|
| 6,201,747 B1 | 3/2001 | Venkatesh et al. |
| 6,370,061 B1 | 4/2002 | Yachareni et al. |
| 6,839,279 B2 | 1/2005 | Yamada |
| 7,035,131 B2 | 4/2006 | Huang et al. |
| 2005/0146346 A1* | 7/2005 | Kakizawa et al. ........... 324/763 |
| 2005/0229050 A1 | 10/2005 | Kanda |

* cited by examiner

US 7,446,549 B2

SEMICONDUCTOR LEAKAGE CURRENT DETECTOR AND LEAKAGE CURRENT MEASUREMENT METHOD, SEMICONDUCTOR LEAKAGE CURRENT DETECTOR WITH VOLTAGE TRIMMING FUNCTION AND REFERENCE VOLTAGE TRIMMING METHOD, AND SEMICONDUCTOR INTEGRATED CIRCUIT THEREOF

BACKGROUND OF THE INVENTION (1) Field of the Invention

The present invention relates to a semiconductor leakage current detector and a leakage current measurement method for detecting a bit line leakage current of a flash memory and the like at high-speed and for executing on-chip trimming of a reference voltage, to a semiconductor leakage current detector with a voltage trimming function and a reference voltage trimming method, and to a semiconductor integrated circuit thereof.

(2) Description of the Related Art

In recent years, non-volatile memories such as a flash memory and an EEPROM are arranged as a large storage capacity memory array using fine memory cells in addition, as memory cells are finely processed, it has become essential that a non-volatile memory is equipped with a reference voltage source that supplies an accurate internal voltage necessary for rewrite and read-out operations.

One of the problems the recent non-volatile memories are facing is the increase in the leakage current of bit lines due to the development of large storage capacity memory array. This problem particularly results from the increase of the leakage current (bit line leakage current) in each memory cell caused by the fine processing, and the increase in the number of memory cells for each bit line. The increase in the bit line leakage current has an impact on the read-out operation of the memory cell, and degrades the control accuracy of the threshold value of the memory cell and the reliability of the data retention characteristic and the like. The threshold value control process (hereinafter, referred to as a program) of the non-volatile memory cell is controlled by the determination of the width and height of a program pulse and the threshold value, in other words, the repetition of a determination operation (referred to as verify) of the cell current. In the verify operation, the bit line leakage current causes the erroneous determination of the cell current with an error which is as much as the leakage current, results in the excess or insufficiency of charge injection, and impedes the normal threshold value control of a memory cell.

To realize the high reliability of the memory, it is necessary that bit lines in which a leakage is detected during a device test be the object for redundancy replacing, and the relevant device be excluded as a defective device. With regard to such bit line leakage current, a leakage current down to several μA is detected by a sense amplifier which is used for read-out operation.

The measurement of the bit line leakage current by a sense amplifier is described in Patent Reference 1 (Japanese Laid-Open Patent Application No. 06-251593). In addition, a direct measurement method of the leakage current is described in Patent Reference 2 (U.S. Pat. No. 6,201,747 B1); the measurement of the threshold value of a cell is described in Patent Reference 3 (U.S. Pat. No. 6,370,061 B1); the measurement of the on-chip current is described in Patent Reference 4 (United States Patent 2005/0229050 A1).

SUMMARY OF THE INVENTION

However, the measurement in the level smaller than μA is required because the accuracy for controlling the threshold value has become essential as a response to the decrease of the cell current caused by fine cell processing, a request for improving the rewritable number of times, and the multi-leveled threshold value. In the conventional measurement methods, such micro current measurement is directly performed through the external pad by the current measurement option of the test equipment, The test equipment shows the performance for current measurement at the relatively low speed from a few mS to a few tens mS per measurement. In order to measure a few thousands of bit lines constituting a memory array, testing time of around a few tens of seconds is thus required causing a huge impact on the testing cost.

Moreover, for the test equipment, a practical method for reducing the testing time is often used through the improvement the throughput and the parallel test for reducing the cost. However, since such parallel measurement requires a test resource independent for each device of the test equipment, expensive test equipment is required.

Furthermore, with regard to the testing cost, the internal reference voltage source, that controls the accuracy of internal voltage in the device, requires a process (trimming) of adjusting each device at a reference value, contributing to the increase of the testing cost.

As described above, since the measurement of the bit line leakage current and the trimming of the reference voltage source are required for non-volatile memories manufactured through fine processing to maintain high reliability, there is a problem that tests for these non-volatile memories cause increases of the testing time, cost of the test equipment and costs for testing including throughput.

An object of the present invention is to provide a semiconductor leakage current detector, a semiconductor integrated circuit, a leakage current measurement method, and a reference voltage trimming method for detecting a bit line leakage current at high speed in order to reduce the number of necessary tests and for executing on-chip trimming of a reference voltage.

The semiconductor leakage current detector of the present invention for solving the aforementioned problem is a semiconductor leakage current detector which determines whether or not a current to be measured is greater than a reference current The detector includes: a first analog switch which causes the current to be measured to flow or to be cut off; a second analog switch which causes the reference current to flow or to be cut off; an integral capacitor which is connected to the first analog switch and the second analog switch, and is charged with the current to be measured or the reference current; a discharge unit which discharges the integral capacitor; and a comparison unit which compares a reference voltage with each of: an integral voltage generated in the integral capacitor by the reference current after the discharge of the integral capacitor; and an integral voltage generated in the integral capacitor by the current to be measured after the discharge of the integral capacitor, This configuration allows the semiconductor leakage current detector to make a highly accurate determination of the current to be measured by canceling process variations in integral capacitors among semiconductor leakage current detectors, canceling the offset of the comparator, and removing noises through the integration operation, because the integral capacitor and the comparison unit are the same in the two kinds of comparison between i) an integral voltage of the reference current and the reference voltage and ii) the integral voltage of the current to be measured and the reference voltage. Furthermore, the semiconductor leakage current detector is included in the semiconductor device so that the speed of the measurement of the current to be measured can be increased compared to that of the conventional technologies.

Here, the comparison unit performs a first comparison of comparing the reference voltage with the integral voltage generated in the integral capacitor by the reference current after the discharge of the integral capacitor, and a second comparison of comparing the reference voltage with the integral voltage generated in the integral capacitor by the current to be measured after the discharge of the integral capacitor, and the semiconductor leakage current detector may determine whether or not the current to be measured is greater than the reference current, based on outputs of the comparison unit as results of the first and second comparisons.

This configuration allows the semiconductor leakage current detector to make a highly accurate determination of the current to be measured by canceling variations in integral capacitors for each semiconductor leakage current detector, canceling the offset voltage in the comparison unit, and removing noises superimposed on the reference current and the current to be measured through integral operation performed on the integral capacitors.

Here, in the second comparison, it is determined whether or not the current to be measured is greater than the reference current, based on whether or not the output of the comparison unit is inverted when a predetermined time passes after the discharge of the integral capacitor, and the predetermined time may be equivalent to a time required for the output of the comparison unit to be inverted in the first comparison.

This configuration allows the semiconductor leakage current detector to make a highly accurate determination of the bit line leakage current (current to be measure) at high speed by canceling the variations in the integral capacitors and integration time, canceling the offset of the comparator, and eliminating noises through the integration operation.

Here, the comparison unit is a comparator which periodically takes samples-and compares the samples; the predetermined time is a time required for the comparison unit to take samples, the time being ranged from after the discharge of the integral capacitor until immediately before the inversion of the output of the comparator in the first comparison. The semiconductor leakage current detector may determine that the current to be measured is greater than the reference current, in the case where the output of the comparator is inverted when the predetermined time passes after the discharge of the integral capacitor in the second comparison.

This configuration allows the semiconductor leakage current detector to make a highly accurate determination of the bit line leakage current which exceeds the reference current.

Here, the comparison unit is a comparator which periodically takes samples and compares the samples; the predetermined time is a time required for said comparison unit to take samples, the time being ranged from after the discharge of said integral capacitor until immediately after the inversion of the output of said comparator in the first comparison. The semiconductor leakage current detector may determine that the current to be measured is smaller than the reference current, in the case where the output of the comparator is not inverted when the predetermined time passes after the discharge of the integral capacitor in the second comparison.

This configuration allows the semiconductor leakage current detector to make a highly accurate determination of the bit line leakage current which is smaller than the reference current, and is effective in the case where the bit line leakage current causes the decrease of a cell current.

Here, the predetermined time is equivalent to n-times as long as the time which is ranged from after the discharge of the integral capacitor until the inversion of the output of the comparator in the first comparison. The semiconductor leakage current detector may determine that the current to be measured is greater than $1/n$ of the reference current in the case where the output of the comparator is inverted when the predetermined time passes after the discharge of the integral capacitor in the second comparison.

This configuration allows the semiconductor leakage current detector to reduce the measurable leakage current by $1/n$ times.

Here, the semiconductor leakage current detector may include a compensation capacitor which is connected to a line for the reference current and to an upstream of the second analog switch, and has a capacitance value which corresponds to a capacitor connected to the line for the current to be measured.

This configuration allows the semiconductor leakage current detector to make a highly accurate determination of the bit line leakage current with a smaller integral capacitor.

Here, the compensation capacitor may include at least one of a metal option unit and a control option unit. The metal option unit is connectable to a wiring layer during a manufacturing process (mask option, etc.) in order to determine the capacitance value of the compensation capacitor, and the control option unit determines the capacitance value based on a selection by an external control signal.

This configuration allows the semiconductor leakage current detector to obtain extensibility which allows the single design to be adapted to various types of circuit configurations and to finely adjust the compensation capacitor corresponding to the measurement path which differs depending on an operation mode of the circuit to be measured.

Here, in the first comparison, the first and second analog switches are turned on, and a stray capacitor connected to a line for the current to be measured and the integral capacitor are simultaneously charged with the reference current This configuration allows the semiconductor leakage current detector to turn on the first and second analog switches in the integration operation of the reference current source, charge the capacitor of the current to be measured and the integral capacitor with the reference current simultaneously, and obtain a high determination accuracy without the compensation capacitor in the case where the signal paths of the circuit to be measured resulting from the stray capacitor does not cause a leakage current. In addition, when measuring the leakage current in plural bit lines, this configuration allows the semiconductor leakage current detector to measure one of the plural bit lines as a reference.

Here, the integral capacitor may be an accumulation-type MOS capacitor,

This configuration allows reducing the area of the capacitor significantly in the case where the integral voltage is equal to or less than the threshold value of the MOS structure.

The integral capacitor may be an accumulation-type P-channel MOS capacitor.

This configuration further allows reducing the area of capacitor to be less than that of the Nch accumulation MOS capacitor, in the case where the integral voltage equal to or less than the threshold value of the MOS structure.

The semiconductor leakage current detector may include at least one of a damping capacitor and a damping resistance element, at least one of the damping capacitor and damping resistance being connected to between an input line and a ground line for the reference voltage of the comparison unit.

This configuration allows reducing noises induced on the reference voltage input and generated during the comparator operation, and shortening the dead time in which the comparator output is invalid, by the dumping capacitor and dumping resistance.

The semiconductor leakage current detector further includes a current mirror circuit which outputs the reference current, An output of the current mirror circuit may be connected to the first analog switch, and an input of the current mirror circuit may be connected to an external pad.

This configuration allows the semiconductor leakage current detector to make a highly accurate determination by using the small integral capacitor because an arbitrary reference current is supplied from the test equipment and the capacitor of the semiconductor leakage current detector is separated electrically.

Here, the semiconductor leakage current detector further includes a current mirror circuit which outputs the reference current. An output of the current mirror circuit may be connected to the first analog switch, and an input of the current mirror circuit may be connected to a current source.

This configuration allows creating an electric system with higher reliability because the leakage current (current to be measured) can be measured not only in the test flow but also when the semiconductor leakage current detector is mounted to the system.

Here, the current mirror circuit includes a supply voltage step-down unit, a current mirror connection transistor unit, a third analog switch, and a fourth analog switch. A supply voltage is supplied to the current mirror connection transistor unit via the supply voltage step down unit; an output of the current mirror connection transistor unit is connected to the first analog switch; an input of the current mirror connection transistor unit is connected to the external pad via said third analog switch, and is connected to a power supply via the fourth analog switch; the third and fourth analog switches are exclusively turned on by a shutdown control signal.

This configuration allows realizing low power consumption when the leak detector is inactivated and reducing the output of the parasitic capacitor only to the drain capacitor.

Here, the current mirror connection transistor unit may include a pair of transistors having a single stage current mirror connection.

This configuration allows obtaining current characteristics sufficient for the practical use based on a very simple structure under the condition in which a range of integral voltage is restricted.

Here, the semiconductor leakage current detector further includes a timer which measures an elapsed time after the discharge of the integral capacitor; a memory for storing the predetermined time; and a control unit which controls the first and second comparisons. The control unit may store, into the memory, the elapsed time as the predetermined time, when the output of the comparison unit is inverted in the first comparison, and in the second comparison, it is determined whether or not the current to be measured is greater than the reference current in accordance with the output of the comparison unit, when the elapsed time reaches the predetermined time stored in said memory.

This configuration allows driving the semiconductor leak current detector on chip so as to perform self test.

Here, the semiconductor leakage current detector may further include a reference voltage source which generates the reference voltage.

In this configuration, the semiconductor leak current detector also includes the reference voltage source so that it can be driven on chip independent from the outside and perform self test.

Here, the semiconductor leakage current detector further includes: a reference register which holds trimming data; a reference voltage source which generates a constant voltage in accordance with the trimming data; a first voltage divider circuit which divides the constant voltage and outputs, as the reference voltage, the divided constant voltage to the comparison unit; and an analog multiplexer which connects one of the integral capacitor and an external pad to an integration voltage input of the comparison unit. The control unit may control said comparison unit so as to compare the reference voltage with a signal inputted via the analog multiplexer from the external pad, and update the trimming data in the reference register based on the comparison result.

This configuration allows the semiconductor leakage current detector to realize a self trimming function of the reference current by a small addition of hardware such as an addition of a trimming function to the reference voltage source.

Here, the semiconductor may further include a second voltage divider circuit which is inserted between the external pad and the analog multiplexer, and has the same layout structure as the first voltage divider circuit.

In this configuration, a relatively small-scaled voltage divider circuit can be used because a trimming accuracy can be determined indifferent to the absolute accuracy of a division voltage in the voltage divider circuit, in the case where the voltage divider circuit is used when the integral voltage is smaller than the target voltage.

Here, the analog multiplexer may be an analog switch inserted between the external pad and the integration voltage input of the comparison unit.

This configuration allows the semiconductor leakage current detector to realize a self trimming function of the reference voltage source by a small addition of circuits such as an addition of a trimming function to the reference voltage source.

Here, the semiconductor leakage current detector further includes an inversion analog multiplexer which switches two inputs of said comparison unit, wherein the control unit may control the comparison unit so as to compare the reference voltage with the signal inputted via the analog multiplexer from the external pad, before and after the two inputs of the comparison unit are switched by the inversion analog multiplexer, and update the trimming data in the reference register based on the comparison results.

This configuration allows using an inexpensive small scaled comparator with large offset by adding an inversion analog multiplexer which is inserted to comparator inputs and completely removing the offset of the comparator.

Here, the current to be measured may be a current which flows in a line connected to a source of a memory cell transistor.

This configuration allows the semiconductor leakage current detector to make a highly accurate determination of the bit line leakage current at high speed in a memory cell used for a source-side read-out method.

The semiconductor integrated circuit of the present invention further includes the aforementioned semiconductor leakage current detector.

This configuration allows the semiconductor leakage current detector to make a highly accurate determination of the bit line leakage current (current to be measured) at high speed by canceling the variations of integral capacitors and integral time, and canceling the offset of the comparator, and removing noises through the integral operation.

Here, the semiconductor integrated circuit further includes; an external analog input/output pad; a reference voltage source which generates the reference voltage; and an analog multiplexer which connects one of internal signal lines of the semiconductor integrated circuit exclusively to the external analog input/output pad, wherein the internal signal lines include at least one of a reference voltage line from the reference voltage source, a current line to be measured for the current to be measured, a reference current line from the semiconductor leakage current detector, and an other signal line.

This configuration realizes an effective use of a single analog test pad so that a semiconductor integrated circuit with high performance testability using a small area is provided.

Here, the semiconductor integrated circuit further includes a timer which measures an elapsed time after the discharge of the integral capacitor; a memory for storing the predetermined time; and a control unit which controls the first and second comparisons. The control unit may store, into the memory, the elapsed time as the predetermined time, when the output of the comparison unit is inverted in the first comparison, and in the second comparison, it may be determined whether or not the current to be measured is greater than the reference current in accordance with the output of the comparison unit, when the elapsed time reaches the predetermined time stored in the memory.

This configuration allows obtaining current characteristics sufficient for the practical use based on a very simple structure under the condition in which a range of integral voltage is restricted Here, the control unit includes a CPU, and a clock generation circuit, and the memory may store a program code and data of the CPU, and a crock generation circuit.

In this configuration, the operation of the semiconductor leakage current detector is controlled by software so that the operation algorithm is easily changed and a design change is not required for a functional change. Furthermore, a CPU, a clock, a timer and the like can use a memory cell together with execution hardware of a general rewrite algorithm so that a high performance detector can be realized with a small area.

Here, the semiconductor integrated circuit includes: a reference voltage source which generates a constant voltage in accordance with voltage data; a voltage divider circuit which divides the constant voltage and outputs, as the reference voltage, the divided constant voltage to the comparison unit; an oscillator which oscillates a operation clock signal; and a holding unit which holds setting data for trimming. The holding unit includes one of a first register for holding the voltage data for setting a voltage of the reference voltage source, a second register for holding data for setting a division ratio of the voltage divider circuit, a third register for holding data for setting a capacitance value of the integral capacitor, a fourth register for holding data for setting a bit-length of the timer, and a fifth register for holding data for setting an oscillation frequency of the oscillator, and the control unit may update the setting data in the holding unit so as to correspond to the current to be measured.

This configuration allows the semiconductor integrated circuit to be easily adaptable to a change to a wider range of the current to be measured by updating software.

Here, the semiconductor integrated circuit further includes: a reference register which holds trimming data; a reference voltage source which generates a constant voltage in accordance with the trimming data; a first voltage divider circuit which divides the constant voltage and outputs, as the reference voltage, the divided constant voltage to the comparison unit; and an analog multiplexer which connects one of the integral capacitor and an external pad to an integration voltage input of the comparison unit. The control unit may control the comparison unit so as to compare the reference voltage with a signal inputted via the analog multiplexer from the external pad, and to update the trimming data in the reference register based on the comparison result.

This configuration allows a realization of a self trimming function of the reference voltage source by a small addition of hardware such as an addition of a trimming function to the reference voltage source.

Here, the semiconductor integrated circuit may further include a second voltage divider circuit which is inserted between the external pad and the analog multiplexer, and have the same layout structure as said first voltage divider circuit.

With this configuration, a relatively small-scaled voltage divider circuit can be used because a trimming accuracy can be determined indifferent to the absolute accuracy of a division voltage in the voltage divider circuit, in the case where the voltage divider circuit is used when the integral voltage is smaller than the target voltage.

The analog multiplexer may include an analog switch which is inserted between the external pad and a wiring which connects the integral capacitor with an integration voltage input of the comparison unit.

This configuration allows a realization of a self trimming function of the reference voltage source with a fewer addition of circuits.

Here, the semiconductor integrated circuit further includes an inversion analog multiplexer which switches two inputs of the comparison unit, wherein the control unit may control the comparison unit so as to compare the reference voltage with the signal inputted via the analog multiplexer from the external pad, before and after the two inputs of said comparison unit are switched by the inversion analog multiplexer, and update the trimming data in the reference register based on the comparison results.

This configuration allows using a small scaled comparator with large offset by completely removing the offset of the comparator.

Here, the semiconductor integrated circuit may further includes a voltage follower which is inserted between the reference voltage source and the first voltage divider circuit; a bypass wiring which bypasses the voltage follower; and a witch circuit which selects one of the voltage follower and the bypass wiring, wherein the switch circuit may select the voltage follower at least in the first and second comparisons.

This configuration allows reducing errors caused by the decrease of the reference voltage when the leak current is detected, and realizing a high-speed rising of the reference voltage when the power is applied to the semiconductor integrated circuit.

Here, the current to be measured may be a current which flows in a line connected to a source of a memory cell transistor.

This configuration allows the semiconductor leakage current detector to make a highly accurate determination of the bit line leakage current at high speed in a memory cell used for a source-side read-out method.

The leakage current measurement method of the present invention is a leakage current measurement method for use in a semiconductor integrated circuit, wherein the semiconductor circuit includes: a first analog switch which causes the current to be measured to flow or to be cut off; a second analog switch which causes the reference current to flow or to be cut off; an integral capacitor which is connected to the first analog switch and the second analog switch, and is charged with the current to be measured or the reference current; a discharge unit which discharges the integral capacitor; and a comparator which compares a reference voltage with each of: an integral voltage generated in the integral capacitor by the reference current after the discharge of the integral capacitor; and an integral voltage generated in the integral capacitor by the current to be measured after the discharge of the integral capacitor. The leakage current measurement method includes: a calibration step of comparing the reference voltage with the integral voltage generated in the integral capacitor by the reference current after the discharge of the integral capacitor, a test step of comparing the reference voltage with the integral voltage generated in the integral capacitor by the current to be measured after the discharge of the integral capacitor, and a determination step of determining whether or not the current to be measured is greater than the reference current, based on results obtained in the calibration step and the test step.

Here, in the calibration step, a time required for the output of the comparator to be inverted after the discharge of the integral capacitor is measured; in the test step, a comparison result obtained by the comparator is checked when the time passes after the discharge of the integral capacitor; in the determination step, it is determined whether or not the integral voltage is greater than the reference voltage, based on whether or not the comparison result is inverted in the test step.

This configuration allows the semiconductor leakage current detector to make a highly accurate determination of the bit line leakage current (current to be measured) at high speed by canceling the variations of integral capacitors and integral time, and canceling the offset of the comparator, and removing noises through the integral operation.

Here, a predetermined time is equivalent to n-times as long as the time which is ranged from after the discharge of the integral capacitor until the inversion of the output of the comparator in the calibration step, and in the determination step, it is determined that the current to be measured is greater than 1/n of the reference current in the case where the output of the comparator is inverted when the predetermined time passes after the discharge of the integral capacitor.

This configuration allows the semiconductor leakage current detector to reduce the measurable leakage current by 1/n times.

Here, the semiconductor integrated circuit further includes a current mirror circuit which outputs the reference current, an output of the current mirror circuit is connected to the first analog switch, and an input of the current mirror circuit is connected to an external pad, The leakage current measurement method further includes: a reference current apply step of applying a reference current from an external pad; and a reference current stabilization step of keeping an operation in the calibration step on standby until the reference current is stabilized as a constant current by charging a parasitic capacitor of the external pad with the reference current This configuration allows a realization of a highly accurate determination of a leakage current at a software level.

Here, the calibration step includes an initialization step, a start step, a read-out loop, and a storage step that are sequentially executed. In said initialization step, the timer is initialized and the integral capacitor is discharged. In the start step, counting of the timer and charging of the integral capacitor with the reference current are started. In the read-out loop, the comparator is periodically read out during the counting of the timer and the charging of the integral capacitor, and the counting of the timer and the read-out loop is stopped, when the comparator indicates that the integral voltage is greater than the reference voltage. In the storage step, a count value counted by the timer is stored when the read-out loop is stopped. Furthermore, the test step includes a capacitor initialization step, a timer start step, a countdown loop, and a determination step that are sequentially executed. In the capacitor initialization step, loading of the count value into the timer stored in the storage step and discharging of the integral capacitor are executed. In the timer start step, counting-down of the timer and charging of the integral capacitor are started. In the countdown loop, the counting down of the timer and the charging of the integral capacitor are executed, and the countdown loop is stopped when a countdown value counted by the timer reaches a predetermined value. In the determination step, a test for determining whether or not the current to be measured is greater than the reference current is executed.

This configuration allows the semiconductor integrated circuit to realize a self test.

The reference voltage trimming method of the present invention is a reference voltage trimming method for use in the aforementioned semiconductor device, the method includes a target voltage apply step, a first intermediate value search step, a comparator input inversion step, a second intermediate value search step, and a trimming value average step that are sequentially executed. In the target voltage apply step, the reference voltage is applied. In the first intermediate value search step, a first trimming intermediate value is obtained, the first trimming intermediate value being a boundary value at which an output of the comparator is inverted. In the comparator input inversion step, inputs of the comparator are switched by the inversion analog multiplexer. In the second intermediate value search step, a second trimming intermediate value is obtained, the second trimming intermediate value being a boundary value at which an output of the comparator is inverted. In a trimming average step, a trimming value is obtained by taking an average between the first trimming intermediate value and the second trimming intermediate value, as a trimming result of the reference voltage, This configuration allows removing influences of the input offset of the comparator and trimming the reference voltage.

Here, the first intermediate value search step includes a trimming initial value setting step, a comparator read-out step, and a trimming loop that are sequentially executed. In the trimming initial value setting step, an initial value is set to the reference voltage register which controls an output level of the reference voltage. In the comparator read-out step, the comparator is read out and whether or not an external voltage which is proportional to a voltage of the external pad is greater than the reference voltage is read out. In the trimming loop, the trimming data in the reference voltage register is moved one step down to a high voltage in the case where the external voltage is smaller than the reference voltage and the comparator is repeatedly read out until the external voltage becomes greater than the reference voltage, and in the case where the external voltage is greater than the reference voltage, the reference voltage register is moved one step up and the comparator is repeatedly read out until the external voltage becomes smaller than the reference voltage.

In the second intermediate value search step, the same processes as in the first intermediate value search step may be performed except the following processes of: setting the first trimming intermediate value to the reference voltage register in the trimming initial value setting step; and outputting the second trimming intermediate value in said trimming loop.

This configuration allows removing the influences of the input offset of the comparator, increasing the speed of searching a second trimming intermediate value, and shortening the trimming time.

As described in the above, the semiconductor leakage current detector of the present invention can make a highly accurate determination of the leakage current at high speed using a simple measurement algorithm by canceling errors resulted from the system of measurement such as variations of integral capacitors and input offset voltage of the comparator, and removing noises superimposed on the current to be measured through the integral operation.

As further information about technical background to this application, the disclosure of Japanese Patent Application No. 2005-370915 filed on Dec. 22, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Hereinafter, embodiments of the present invention shall be described with reference to the attached drawings. Note that, the embodiments of the present invention show only the examples so that the present invention is not limited to the disclosure of the embodiments.

First Embodiment

Figure 3:
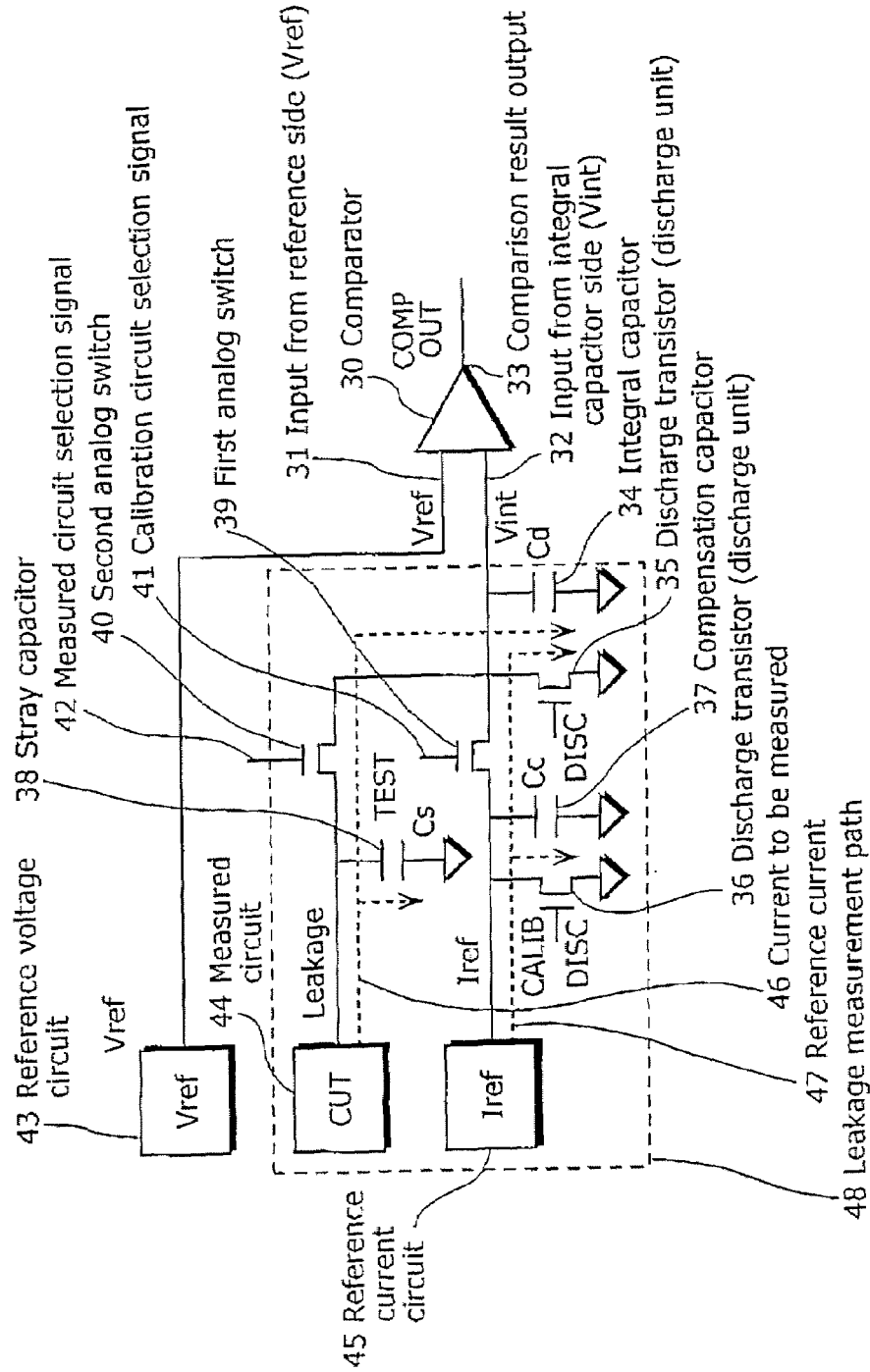
FIG. 3 is a schematic circuit diagram of a semiconductor leakage current detector according to a first embodiment.

FIG. 3 is a schematic circuit diagram of a semiconductor leakage current detector according to the first embodiment of the present invention. In FIG. 3, a reference voltage Vref is supplied to a reference-side input 31 of a comparator 30 from a reference voltage circuit 43, and an integral voltage Vint is supplied to an integral capacitor-side input 32 to which the integral capacitor 34 is connected. A discharge transistor 35 is connected in parallel to the integral capacitor 34 (Cd), and discharges a charge to a ground level. A measured circuit 44, which is a circuit to be measured, Is made up of bit lines of a memory and the like, and supplies a current to be measured 46 (Ileak) to the integral capacitor 34 through a second analog switch 40. Furthermore, the reference current circuit 45 supplies a reference current 47 (Iref) to the integral capacitor 34 via a first analog switch 39. A stray capacitor 38 (Cs) is connected to a current path of the measured circuit 44, and a compensation capacitor 37 (Cc) having a capacitance value, which is equivalent to the stray capacitor 38, is connected to the reference current circuit 45. A discharge transistor 36 is connected in parallel to the compensation capacitor 37, and discharges a charge to the ground level.

Hereinafter, it shall be described about a comparison operation between the reference current 47 and the current to be measured 46. The comparison operation is mainly divided into a calibration operation and the following test operation.

(Calibration Operation)

The calibration operation starts with the discharge operation of the integral capacitor 34 and the compensation capacitor 37 to the ground level. A reference current circuit may be kept activated in the case where a reference current is sufficiently small during the aforementioned discharge operation to the ground level (for example, several μA). Next, a calibration circuit selection signal 41 is set to be active and a measured circuit selection signal 42 is set to be inactive. Following that, current integration to the integral capacitor is started by setting the discharge transistors 35 and 36 to OFF (T=0). During the current integration, the reference current 47 (Iref) charges up the compensation capacitor 37 (Cc) and the integral capacitor 34 (Cd). The calibration operation is completed with an acquisition of an integral time Tint (T=Tint) which is a duration from the start of the calibration operation to immediately before the inversion of the comparison output 33 of the comparator during the charge. Here, Tint is expressed by the following (Expression 1) according to a conservation law of charge, where the offset of the comparator 30 is defined as Vo.

$$\text{Tint}=(V\text{ref}+V\text{o})\times(Cd+Cc)/I\text{ref} \quad \text{(Expression 1)}$$

(Test Operation)

The test operation starts with turning on the discharge transistor 35 and discharging the integral capacitor 34 and the stray capacitor 38 to the ground level after activating the measured circuit selection signal 41 and setting the calibration circuit selection signal 41 as inactive. Next, a (T=0) integration is started by turning off the discharge transistor 35, and whether or not the current to be measured 46 is greater than the reference current 47 is determined by referring to the comparison output 33 after the integral time Tint.

Note that, in the case where the bit line leakage current is the current to be measured, the test operation may be repeated for a bit line as a measurement unit (single bit line or plural bit lines).

(Determination Algorithm)

When the integration is started, Vint<Vref is satisfied. Therefore, the condition under which the comparator output is inverted is expressed by the following expression 2.

$$V\text{int}+V\text{o}>V\text{ref}+V\text{o} \quad \text{(Expression 2)}$$

Furthermore, the following expression 3 is established according to the charge conservation law, where time T=Tint.

$$\text{Tint}=(V\text{int}+V\text{o})\times(Cd+Cs)/I\text{leak} \quad \text{(Expression 3)}$$

When the expressions 1 and 3 are substituted into the expression 2, the relationship between Ileak and Iref is obtained as shown in the following expression 4.

$$I\text{leak}>I\text{ref}\times(1+Cs/Cd)/(1+Cc/Cd) \quad \text{(Expression 4)}$$

The input offset voltage Vo of the comparator is irrelevant to the expression 4. Furthermore, the following expression 5 is obtained by setting the stray capacitance value Cs and the compensation capacitance value Cc so as to be identical to each other.

$$I\text{leak}>I\text{ref} \quad \text{(Expression 5)}$$

Specifically, it is indicated that the leakage current exceeds the reference current in the case where the comparator output is inversed after the integral time. Based on the expression 4, when Cd>>Cs, Cc, the matching accuracy between Cs and Cc has a little influence on the determination result. On the contrary, when the matching accuracy between Cs and Cc is increased, only a small integral capacitor Cd may be used. The smaller the integral capacitance is the shorter the time necessary to reach the reference voltage becomes. Therefore, it is possible to execute a leakage current determination at high speed.

(Regarding Accuracy)

The input offset voltage Vo of the comparator is cancelled because the integral capacitor is always fixed to the comparator input.

Therefore, it is preferred to form the integral capacitor within the chip. Furthermore, the current to be measured such as a reference current and a bit line leakage current has a very small steady-state current value so that noise is likely to be superimposed on the current. However, the noise components can be restrained by integrating a current into the integral capacitance and an S/N (signal to noise ratio) used for the determination can be improved.

Also, the integral time only needs to keep a relative accuracy at the time of repetition, by applying the same value to the integral time and the integral time for determination.

According to the first embodiment, the semiconductor leakage current detector can make a highly accurate determination of a bit line leakage current by canceling the variations of integral capacitors and the errors caused by the measurement system such as an input offset voltage of the comparator and the like, and removing the noise components superimposed on the current to be measured through integration operation. Furthermore, it is possible to make a highly accurate determination of the leakage current at high speed using the compensation capacitor, even with a small integral capacitor, As an embodiment of a circuit, the leakage current as much as 100 nA can be measured in 10 μS, so that a high-speed measurement which is a thousand time higher than the case in which the test equipment directly measures a current from outside the circuit.

Note that, in the case where the value immediately after the inversion of the comparator output is defined as Tint in the calibration operation, the semiconductor leakage current detector can make a highly accurate determination that the bit line leakage current falls below the reference current when detecting, by using the value of Tint, that the output of the comparator is not inverted in the test operation. The Tint may be the time immediately after the inversion because there is a dead area (unstable) of the comparator near the reference voltage. This determination mode is useful in the case where the leakage current to neighboring cells such as a cell current in a virtual ground array used for a read-out in the source side exists as the decrease of the cell current.

Second Embodiment

Figure 4:
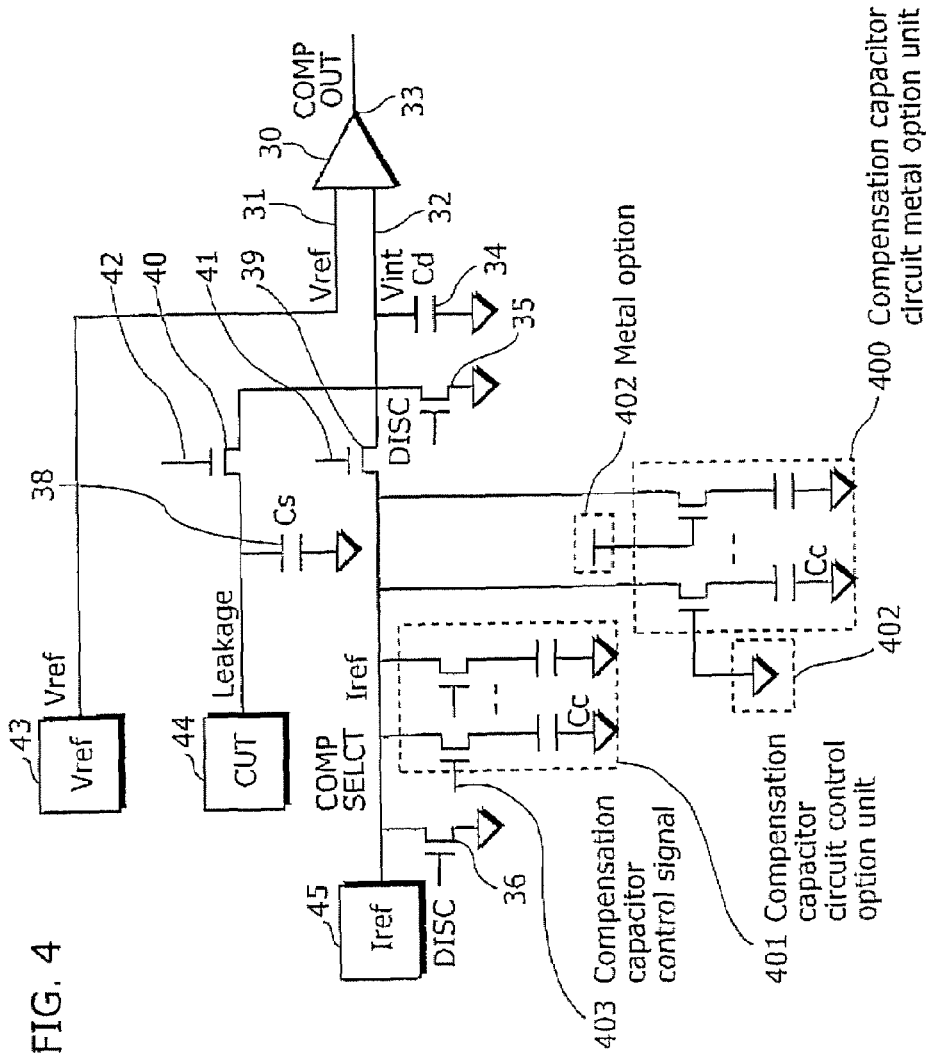
FIG. 4 is a schematic circuit diagram of a semiconductor leakage current detector according to a second embodiment.

FIG. 4 is a schematic circuit diagram of a semiconductor leakage current detector with a greater range of application in which the compensation capacitor is varied, in addition to the configuration described in the first embodiment. In FIG. 4, the compensation capacitor is made up of a metal option unit 400 and a control option unit 401, as a compensation capacitor circuit. The metal option unit 400 sets a gate voltage of the transistor which is connected to the capacitor in series, based on the potential of the metal layer connected to the gate, and sets a fixed value portion of the compensation capacitor. Also, the metal option unit 400 is connectable to a wiring layer during a manufacturing process (mask option, etc.) in order to determine the capacitance value of the compensation capacitor. The control option unit 401 selectively sets the potential of the gate of the transistor which is connected to the capacitor in series, and sets the variable portion of the compensation capacitor. Furthermore, the control option unit 401 determines the capacitance value based on a selection by an external control signal.

For example, in the case where the measured circuit determines a bit line leakage current, the metal option unit 400 absorbs a fixed parasitic capacitance difference due to the array configuration difference such as a bit line length and the number of memory cells per bit line. The control option unit 401 absorbs the variable parasitic capacitance difference (for example, the number of bit lines to be selected) in accordance with a bit line selected by a decoder in an array.

Note that, whereas the selectivity of capacitors is realized by changing the potential of the gate of the transistor in the metal option unit, it is obvious that the same effect can be obtained by directly connecting the capacitors using a metal layer. Furthermore, the metal option unit is unnecessary in the case where the leakage detector is optimized for a single array configuration.

According to the second embodiment, the semiconductor leakage current detector is applicable to the circuit having a different array configuration based on only a single circuit design, and the compensation capacitor can be finely adjusted according to a change of a measurement path caused by a difference in an operation mode by the measured circuit. Therefore, the accuracy of determining the bit line leakage current can be further improved.

Third Embodiment

Figure 5:
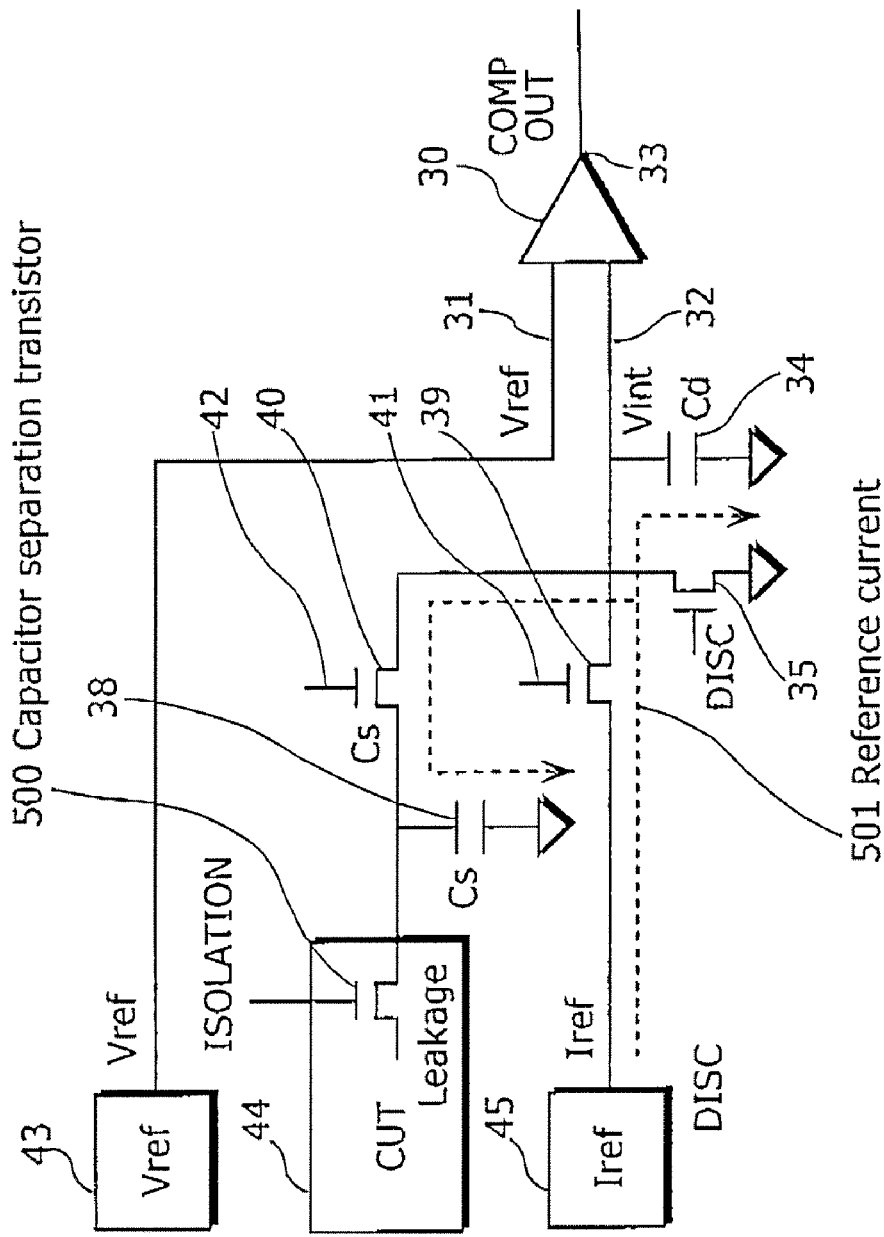
FIG. 5 is a schematic diagram showing a configuration of a semiconductor leakage current detector according to a third embodiment.

FIG. 5 is a schematic diagram showing a configuration of a semiconductor leakage current detector capable of deleting a compensation capacitor or downsizing the capacitance of the capacitor, in addition to the configuration of the first embodiment. In FIG. 5, the main differences with the first embodiment are the deletion of the compensation capacitor 37 connected to the output of the reference current 47, the deletion of the discharge transistor 36, and the range of charging the reference current 501 (charge the stray capacitor 38). It shall be described about the comparison between the reference current 501 and the current to be measured. The comparison operation is mainly divided into the calibration operation and the following test operation.

(Calibration Operation)

The calibration operation starts with the discharge operation of the integral capacitor 34 and the stray capacitor 38 to the ground level via the discharge transistor 35, selecting the measured circuit selection signal 42. In the case where a reference current is sufficiently small (for example, several µA), a reference current circuit may be kept activated. The calibration circuit selection signal 41 and the measured circuit selection signal 42 are simultaneously selected, and the (t=t0) integration is started by turning the discharge transistor 35 off. The reference current 501 (Iref) charges up the stray capacitor 38 (Cs) and the integral capacitor 34 (Cd). The calibration operation is completed by obtaining the time Tint2 which is the time immediately before the inversion of the comparison output 33, by referring to the comparison output 33 of the comparator during the aforementioned charging. Here, Tint2 is expressed by the following expression 6 based on the charge conservation law when defining the offset of the comparator 30 as Vo.

$$\text{Tint2} = (V\text{ref} + V o)^*(Cd + Cs)/I\text{ref} \quad \text{(Expression 6)}$$

(Test Operation)

The test operation starts with the discharge of the integral capacitor 34 and the stray capacitor 38 to the ground level by turning the discharge transistor 35 on. Next, the measured circuit selection signal 42 is activated and the calibration circuit selection signal 41 is set to be inactive. The integration of a leakage current in the (t=t0) measured circuit 44 is started by turning the discharge transistor 35 off, and determines whether or not the current to be measured is greater than the reference current 501 by referring to the comparison output 33 after the integral time Tint 2.

The condition for the comparator to be inverted is expressed by the following expression.

$$V\text{int} + Vo > V\text{ref} + Vo \quad \text{(Expression 7)}$$

The following expression 8 is established according to the charge conservation law when time t=Tint2.

$$\text{Tint2} = (V\text{int} + Vo)^*(Cd + Cs)/I\text{leak} \quad \text{(Expression 8)}$$

The following expression 9 is obtained by substituting the expressions 6 and 8 into the expression 7.

$$I\text{leak} > I\text{ref} \quad \text{(Expression 9)}$$

Specifically, it is indicated that the leakage current exceeds the reference current in the case where the comparator output is inversed after the integral time.

The input offset voltage Vo and Cs of the comparator is irrelevant to the expression 9. The deletion of Cc and the deletion of the matching error between Cd and Cs can be realized by using Cs for the integration of the reference current, so that a smaller integral capacitor Cd can be used. It requires efforts to keep the capacitance matching accuracy between Cd and Cs in a greater range of the integration voltage because Cd and Cs have different voltage dependencies on the capacitances unless Cd and Cs are made of capacitors of the same configuration. On the contrary, Cd and Cs are commonly used for the calibration operation and the test operation in the present embodiment, so that the best capacitance matching accuracy is obtained.

The capacitor separation transistor 500 is placed in the measured circuit 44 shown in FIG. 5 so as to separate the measured circuit which is a leakage source. In this case, if the bit lines to be measured are stratified, the capacitor separation transistor 500 is preferred to be connected to the bit line of an upper hierarchy. Furthermore, the compensation capacitor may be placed on the reference side in order to improve accuracy. Here, the compensation capacitor has a capacitance value which corresponds to the capacitance value separated by the capacitor separation transistor, and which is smaller than the original compensation capacitor Cs. Therefore, the compensation capacitor does not give much impact on an accuracy of determining a matching error. In the case where the measured circuit is a memory array, the capacitor separation transistor may be a column selection transistor.

Whereas the integral time Tint of the reference current and the integral time of the current to be measured are the same in the present embodiment, the integral time of the current to be measured may be n-times as much as the Tint. In this case, the reference current is equivalent to 1/n times of Tint. Accordingly, a measurable leakage current can be further reduced. Here, it is necessary to consider the multiple accuracy of time since it affects the measurement accuracy. However, in the case where time is measured by a digital counter, the realization of the leakage current detector is relatively easy.

According to the present embodiment, when a leakage current determination is performed in plural bit lines, it is possible to measure one of the plural bit lines as a reference for a parasitic capacitor.

As described in the above, according to the third embodiment, a highly accurate determination can be performed by a small integral capacitor which does not require a parasitic capacitor in the case where a signal path resulted from the parasitic capacitor of the measured circuit does not involve a leakage current.

Fourth Embodiment

Figure 6A:
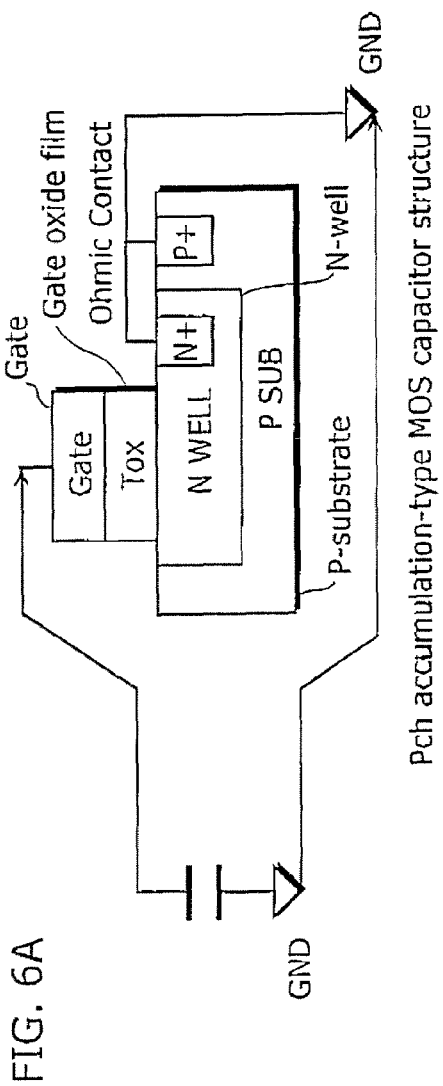
FIGS. 6A and 6B are explanatory diagrams of a P-channel accumulation type MOS capacitor according to a fourth embodiment.
Figure 6B:
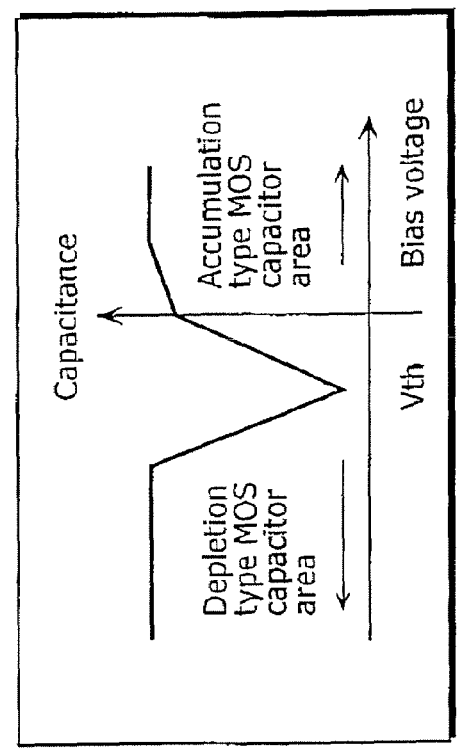

The fourth embodiment describes an example of a semiconductor leakage current detector which is reduced in area by using an accumulation-type MOS capacitor for the integral capacitor according to the first embodiment. In the first embodiment, the voltage level of the integral capacitor ranges from several tens mV to several hundreds mV, and is in a range less than a threshold value of the MOS capacitor, in order to increase the determination speed. In such low voltage area, a substrate of a commonly-used depletion-type CMOS capacitor is in a depletion state, causing a problem that the capacitance value equivalent to a fraction of a capacitance of normal inverted region. In order to solve this problem, it is preferred to use a Pch accumulation-type MOS capacitor as an integral capacitor. FIG. 6 is an explanatory diagram of the Pch accumulation-type MOS capacitor. In FIG. 6, the accumulation capacitor biases the Pch accumulation-type MOS capacitor placed under the gate oxide film Tox so that the Pch-accumulation-type MOS capacitor is set to be in an accumulation mode. In the case of the Pch accumulation-type MOS capacitor, an N-type substrate which is biased at 0V is placed on the GND side of the capacitor, and the gate electrode is biased at a positive voltage so that the substrate is not depleted. As shown in the bias dependence of the Pch accumulation-type MOS capacitor in FIG. 6, in the case where the gate electrode is a positive bias, the capacitance dependence by the bias is small so that it is a desired for an integral capacitor. Since the Pch accumulation-type MOS capacitor has small voltage dependence as a compensation capacitor, it matches well with the stray capacitance parasitic capacitor. Here, it is ideal to use, as a compensation capacitor, a capacitance element having the same configuration as the capacitance of the stray capacitor (same voltage dependence). When being biased at a negative voltage, the gate electrode serves as a PchMOS depletion-type capacitor, and the substrate is depleted together with the bias voltage. The capacitance decreases continuously until an inverted layer is formed when the bias voltage reaches the threshold value of the MOS configuration. Note that, in the case of the CMOS process on the Pch substrate, the Pch accumulation-type MOS capacitor grounds the N well so that an NPN-type parasitic bipolar transistor is formed, Therefore, it is necessary to sufficiently secure a guard band of the P well so that the Pch substrate is not biased to the positive voltage, in terms of the layout. Furthermore, an Nch accumulation-type device is formed by inverting the polarity of the substrate. In this case, the gate electrode is a ground, and the P substrate is a positive potential (N substrate should be biased higher than this positive potential). Aside from the layout such as a contact area of the substrate, the Pch accumulation-type MOS capacitor has the largest capacitance per unit area, The Pch accumulation-type MOS capacitor is the best suitable integral capacitor which has a large capacitance (for example, 10 pF) and is used restrict to a low-speed operation (10 μS) as represented by the semiconductor leakage current detector of the present invention.

According to the fourth embodiment, in the case where the integration voltage is less than the threshold of the MOS configuration, the area occupied by the capacitance element is significantly reduced. Further reduction in the area can be realized by utilizing the Pch accumulation MOS capacitor for the capacitance. Note that, whereas the accumulation capacitor is described as the integral capacitor which requires the largest area in the present embodiment, it is obvious that the similar effect can be obtained even in the case of adapting a compensation capacitor with a relatively large capacitance value when considering that, when a small integral capacitor is used, it becomes greater than the normal depletion-type CMOS capacitor due to overhead of the substrate contact in the layout.

Fifth Embodiment

Figure 7:
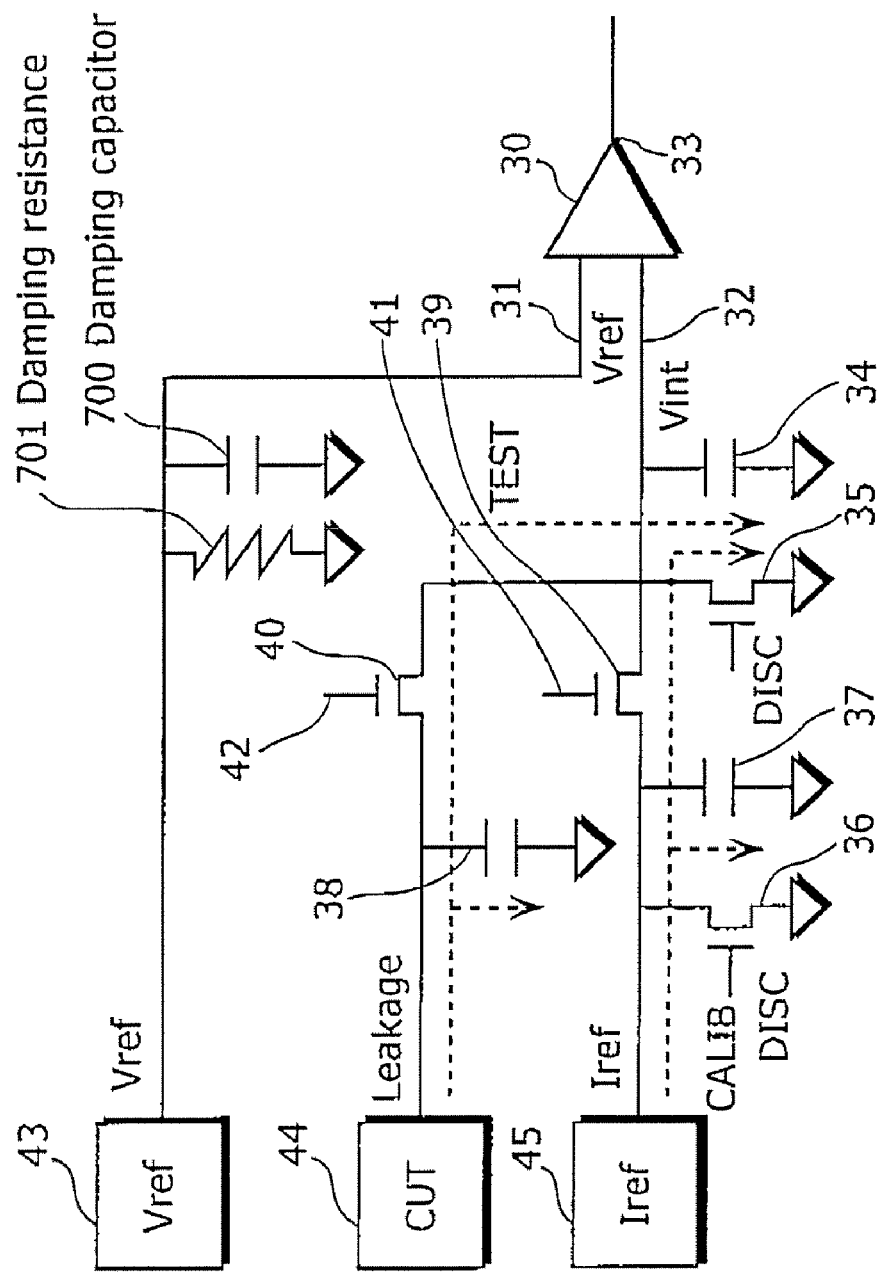
FIG. 7 is a schematic circuit diagram of a semiconductor leakage current detector according to a fifth embodiment.
Figure 16:
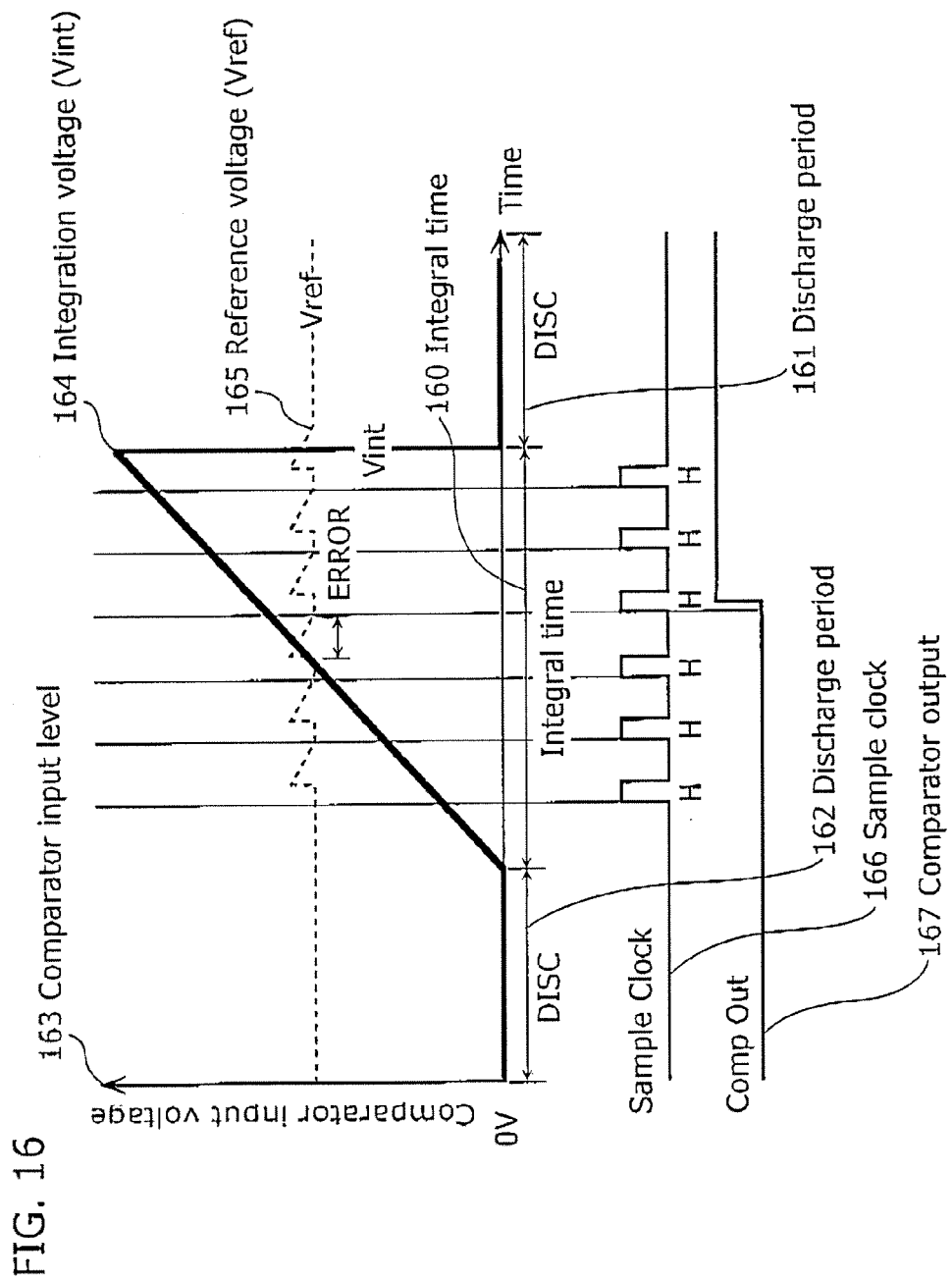
FIG. 16 is an explanatory diagram showing a temporal development of an input voltage of a comparator according to a fourteenth embodiment.

FIG. 7 is a schematic circuit diagram of a semiconductor leakage current detector having a configuration in which noise of the comparator input is reduced from the configuration of the first embodiment. In FIG. 7, a damping capacitor 700 and a damping resistance 701 are connected in parallel to the reference side input 31. The damping capacitor 700 reduces the amplitude of coupling noise generated in Vref at the time of comparator operation (equalization and charging operation), and the damping resistance 701 reduces the induced noise and shortens the dead time of the comparator. Furthermore, the capacitance difference between the capacitor side input 32 and the reference side input 31 can be decreased so that resistance to the common mode noise which is AC coupled to the inputs can be improved. Accordingly, it is preferred to match the damping capacitance with the input capacitance of the integral capacitor side input 32 as long as there are available areas. Also, the damping resistance 701 reduces the induced noise and the noise is reduced faster as the resistance is lower. Therefore, it is preferred to set the reference voltage as long as possible within a range in which the reference voltage can be supplied. With reference to FIG. 16, it is described a temporal development of the input voltage of the comparator. In the diagram, a vertical axis indicates a comparator input voltage and a horizontal axis indicates time. The reference voltage 165 is always biased at a certain value Vref. Furthermore, the integration voltage is discharged at 0V during the discharge and the integration voltage 164 is monotonously increased during the integral operation. In the sampling by the comparator, a sample clock 166 is sampled during the period of H, and is initialized when it falls (equalization of an internal node, pre-charge operation and the like). At the initialization timing, a spike noise is induced into the reference voltage 165 by the capacitive coupling of the internal signal for the initialization and the reference voltage input. The relax time of spike noise is equivalent to a dead time of the comparator.

According to the fifth embodiment, a high-speed calibration operation can be realized by reducing the-noise induced in the Vref due to the coupling at the time of comparator operation, and shortening the comparator dead time. Furthermore, the resistance against the common mode noise is improved and the operational reliability in the on-chip environment in which a large amount of noise is produced can be increased.

Note that, whereas noise can be reduced by including a discharge transistor in place of the damping capacitor and the damping resistance, a re-charging time (also referred to as dead time) to reach the Vref level is necessary.

Sixth Embodiment

Figure 8:
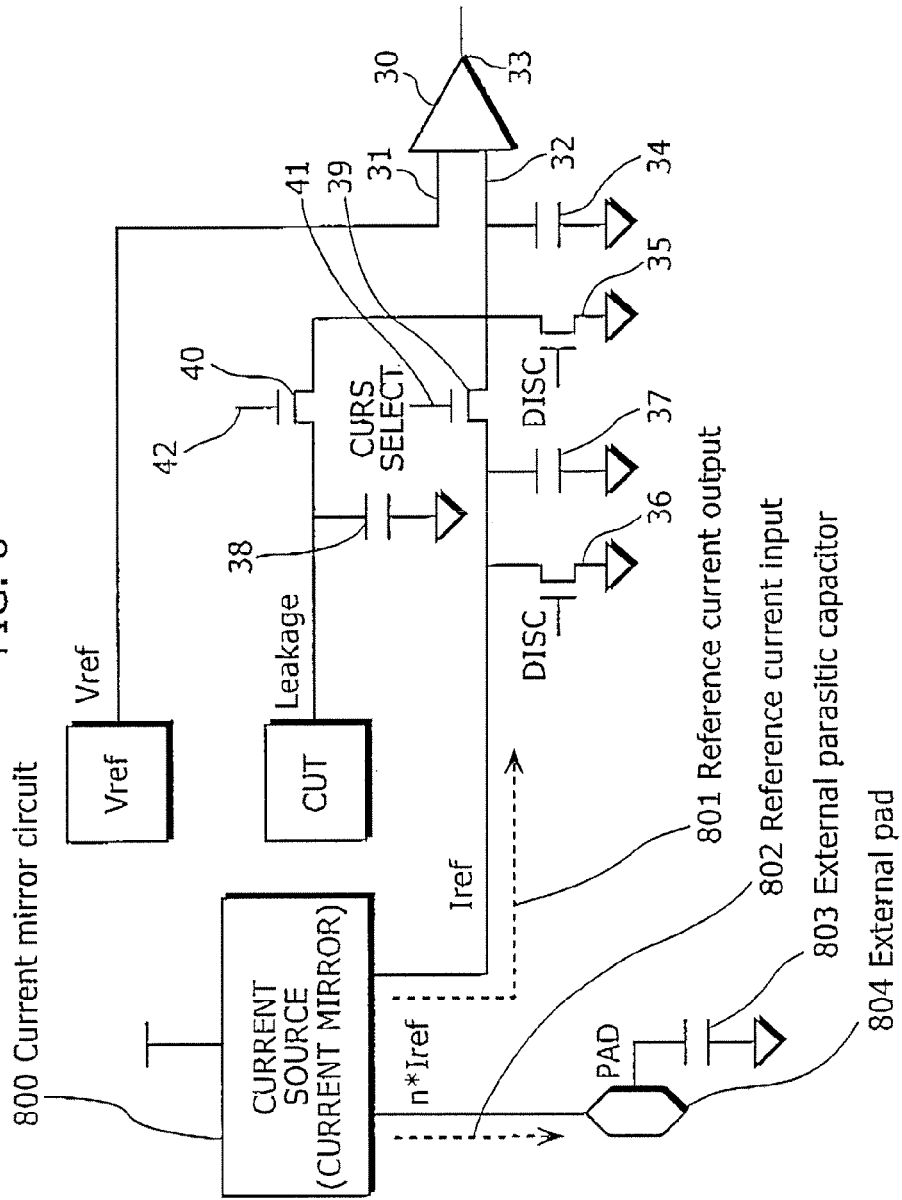
FIG. 8 is a schematic circuit diagram of a semiconductor leakage current detector according to a sixth embodiment.

FIG. 8 is a schematic circuit diagram of a semiconductor leakage current detector which supplies a reference current from the external pad, according to the configuration of the first embodiment. In FIG. 8, the reference current circuit is made up of a current mirror circuit 800. The current mirror circuit 800 is used for generating a micro current, and outputs a reference current output 801 (Iref) as a 1/N mirror current of the reference input 802 which is a sync input from the external pad 804. The external pad has a parasitic capacitor 803 which is configured as an output capacitance of a detector, a capacitance of a device interface, and the like. The external parasitic capacitor 803 is electrically separated from the input node of the comparator in the detector by using the current mirror circuit 800.

(Reference Input Sequence)

The input sequence of the reference current to the external pad is described. A constant current source of the test equipment is connected to the external pad, and is waited for the potential of the external pad to be stable. A part of the sync current which flows in the test equipment is used for charging the parasitic capacitor immediately after the current input. Therefore, the potential of the external pad varies causing instability of the reference current. The stability of the reference current output 801 can be verified by measuring the potential of the external test pad. As a specific example of such current, when the output current is set at 100 nA and the mirror ratio is N=10, the external pad 804 biases the constant current load from the test equipment. The greater current which is biased to the external pad results in a faster current output settling time. On the contrary, when a micro current is necessary, the size of a transistor which constitutes a current mirror circuit is increased. There is thus a tradeoff between a decrease in the size of a transistor and a decrease in current. Note that, it is obvious that the settling time does not affect the test time because the settling time is required only once if the reference current, which is now in operation, in the semiconductor current detector is kept activated.

It is difficult to supply a reference current directly from the external pad because of the following parasitic capacitor relationship. The parasitic capacitor of the external pad is as large as several hundreds pico farad (pF) including the capacitance of the current source of the test equipment, and relies on the test equipment. Accordingly, it is necessary to use an integral capacitor having a capacitance value which is at least larger than a capacitance value, by one order of the magnitude, of the external parasitic capacitor in order to use such large unstable capacitor as a reference current source. However, such large capacitor cannot be allowed to be used on-chip in terms of costs, so that a penalty of placing the capacitor outside the chip needs to be considered. Furthermore, the speed of determining a leakage current is decreased at least down to two orders or more of magnitude so that there is no big difference compared to the case of measuring the leakage current directly using the external pad. Therefore, the high-speed feature of the on-chip detector is faded. The reference current supply method for, use in the current mirror circuit is highly consistent with the semiconductor leakage current detector of the present invention.

According to the sixth embodiment, a reference current with absolute accuracy can be supplied at low cost by supplying the reference current from the external pad. Furthermore, the reference current can be easily changed. In the mirror circuit, the capacitor of the external pad can be electrically separated from the integral capacitor and the compensation capacitor. Therefore, a small integral capacitor can be adapted and a high-speed/high-accurate semiconductor leakage current detector can be provided at low cost.

Seventh Embodiment

Figure 9:
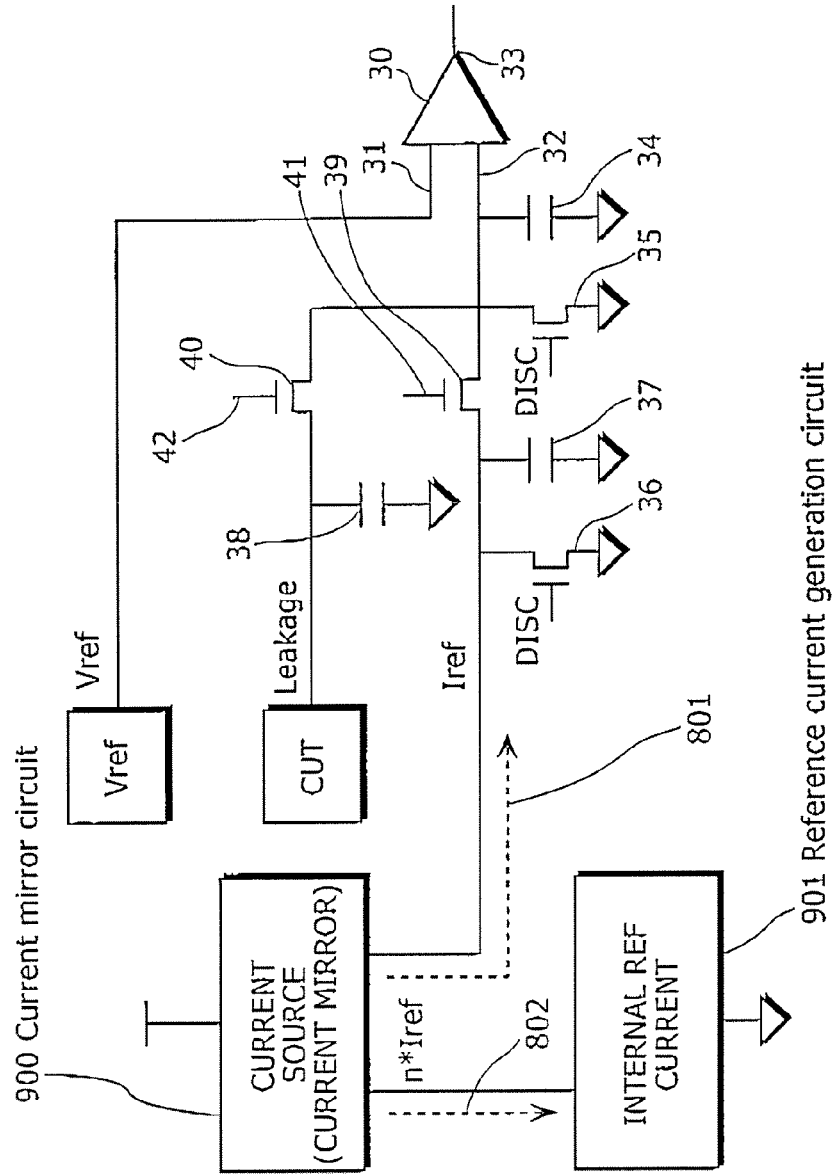
FIG. 9 is a schematic circuit diagram of a semiconductor leakage current detector according to a seventh embodiment.

FIG. 9 is a schematic circuit diagram of a semiconductor leakage current detector in which the reference current, which had been supplied from the external pad, is internally generated, according to the configuration of the sixth embodiment. In FIG. 9, the input current of the current mirror circuit 900 is supplied from the reference current generation circuit 901. As similar to the case of the sixth embodiment, the output capacitor of the reference current generation circuit 901 is electrically separated from the integral capacitor and the compensation capacitor, reducing the integral capacitor. The following explains the benefit of equipping the reference current generation circuit even with the increase in the layout area, whereas the degree of freedom of the reference current is degraded compared to the case of the external pad input. In the sixth embodiment, a test equipment and a corresponding circuit are necessary to be placed outside the device for measuring the leakage current, and are used in a limited temperature voltage range during a test flow. In the present embodiment, the leakage current can be measured not only during the test flow but also during the implementation onto a product so that a highly reliable system can be constructed. Furthermore, the more accurate determination can be performed in the case where the temperature characteristics of the leakage current to be measured is predicted, because supply voltage and temperature dependency can be previously set to the reference current by applying the reference current to the device.

According to the seventh embodiment, the more reliable system can be constructed. Because the bit line leakage current is determined during the implementation to a product in various temperature/voltage states and the determination result can be used for a repair with a redundancy in a memory array, an alarm to a user and the like.

Note that, it is obvious that the degree of freedom of the reference current can be realized as similar to the case of the sixth embodiment in a combined use with the external pad in the present embodiment.

Eighth Embodiment

Figure 10:
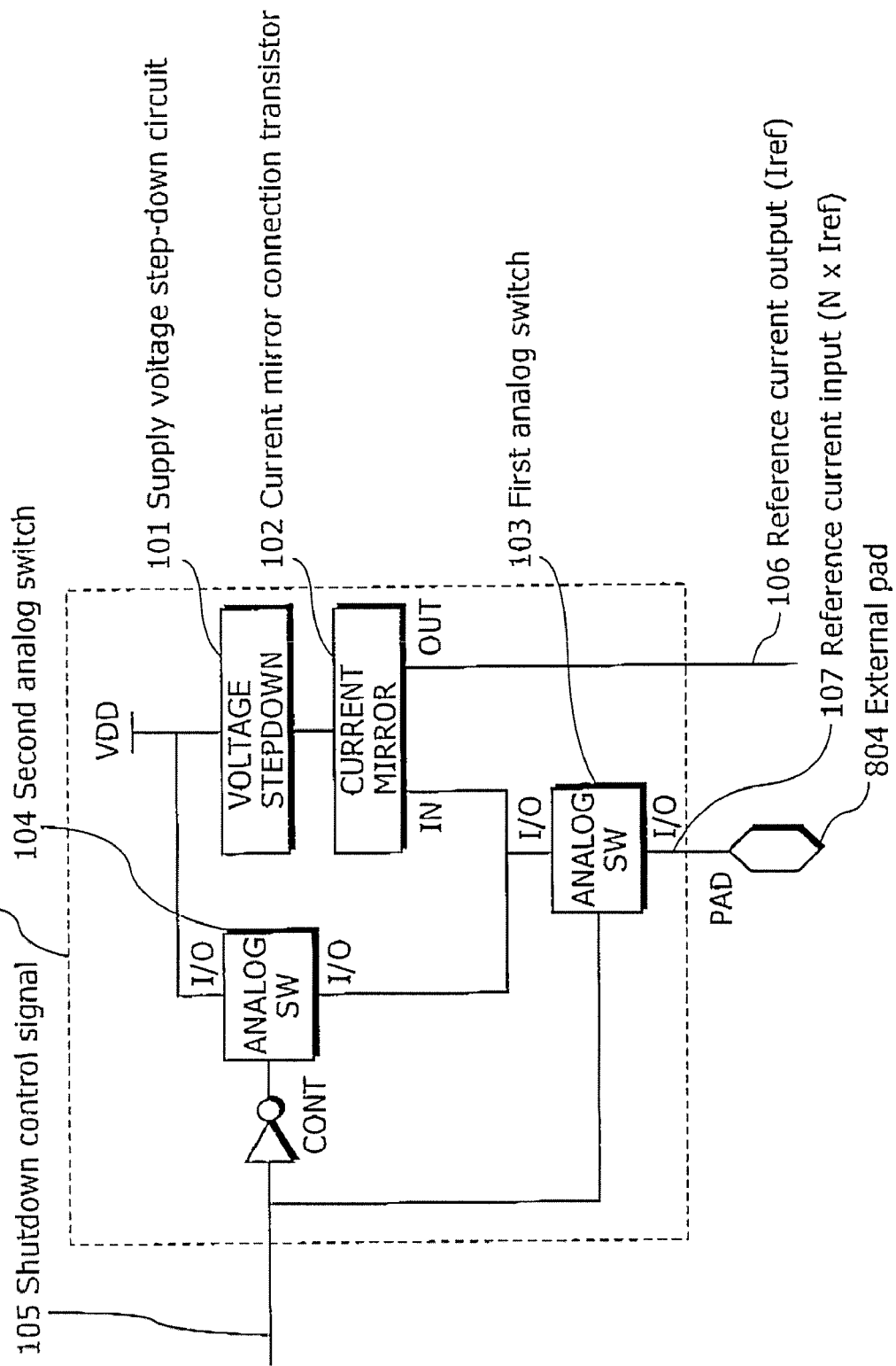
FIG. 10 is a block diagram showing a current mirror circuit according to an eighth embodiment.
Figure 11:
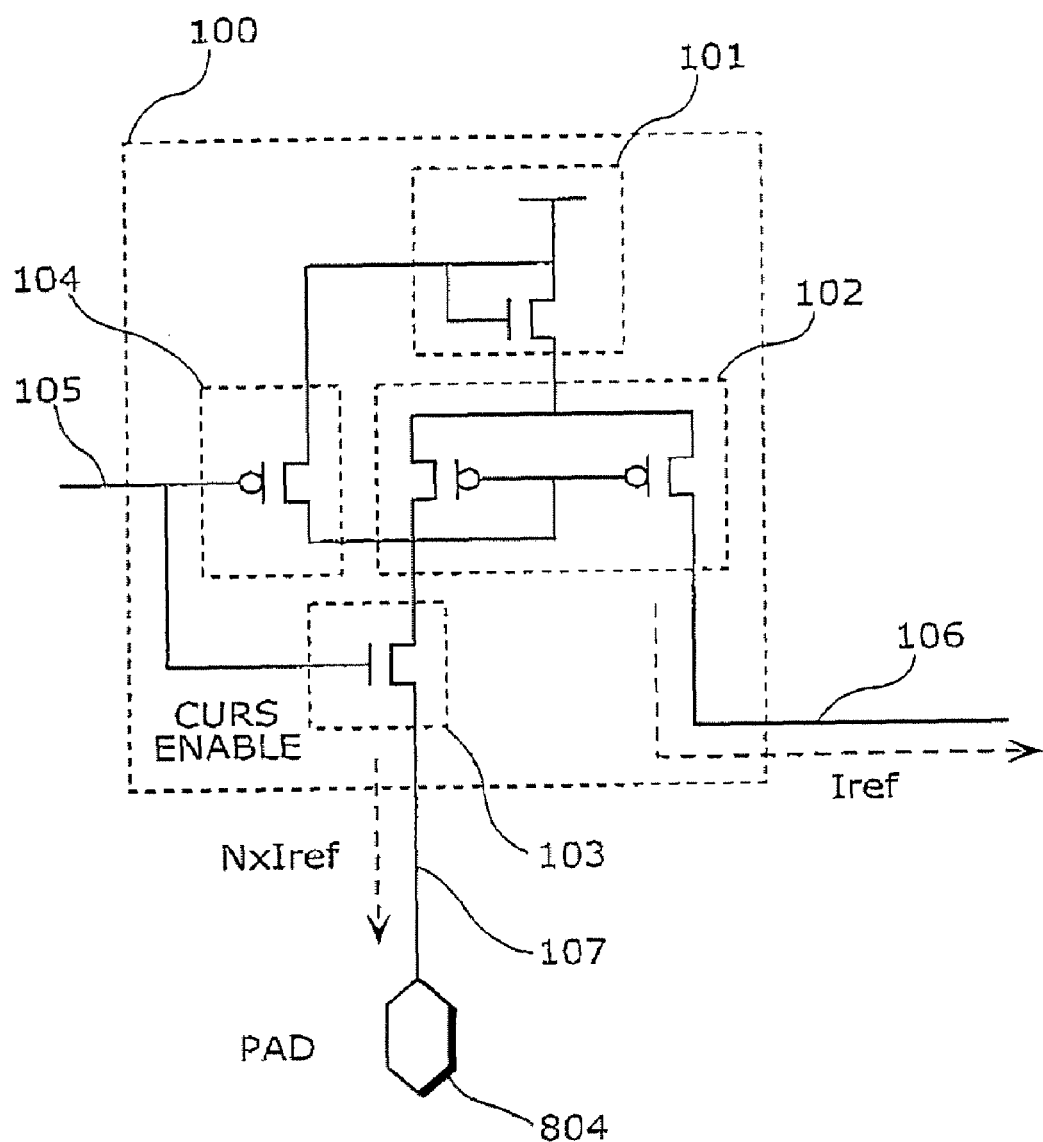
FIG. 11 is a circuit diagram showing the current mirror circuit at a transistor level.

FIG. 10 is a detailed block diagram showing the current mirror circuit indicated in the sixth and seventh embodiments. FIG. 11 is a circuit diagram showing the current mirror circuit shown in FIG. 10 at a transistor level.

In FIG. 10, a supply voltage step-down circuit 101 which reduces a supply voltage VDD is connected to a current mirror connection transistor 102 utilizing the reduced supply voltage as a power source, in the current mirror circuit 100. A reference current output (Iref) 106 of the current mirror connection transistor 102 outputs a reference current, and a reference current input 107 (N×Iref) is connected to the external pad 804 via a first analog switch 103. Furthermore, the reference input (N×Iref) is connected to the supply voltage VDD via a second analog switch 104.

When the second analog switch 104 Is turned on, the output transistor of the current mirror connection transistor 102 is cut off. The first analog switch 103 and the second analog switch 104 are controlled so as to be exclusively turned on. When the external pad is cut off by the first analog switch, the current output of the current mirror circuit is shut down due to its high impedance state.

FIG. 11 shows an example of a circuit configuration under the condition having the process of 0.18 μm, the output current of less than 1 μA, and the supply voltage of 1.8V. In FIG. 11, the supply voltage step-down circuit 101 is made up of an Nch transistor having a one-stage diode connection, The current mirror connection transistor 102 is made up of one stage of a pair of Pch transistors having a mirror current ratio of 1:N.

The supply voltage step-down circuit cuts down a common voltage from the source side of the pair of the current mirror connection transistors. Accordingly, the layout area of the current mirror connection transistor can be reduced, while minimizing the impacts on the matching characteristics of the current mirror connection transistor. Therefore, a smaller current can be provided with a smaller layout.

The first analog switch can utilize the Nch transistor since the voltage level of the external pad is near the ground, and the second analog switch is connected to the power level and can utilize the Pch transistor. Furthermore, the gates of these transistors are connected to the shut down signal 105 so that a complementarily connection operations are realized with a very simple configuration.

According to the eighth embodiment, practical current characteristics can be obtained with the very simple configuration under the condition in which an integration voltage range is restricted.

Ninth Embodiment

Figure 1:
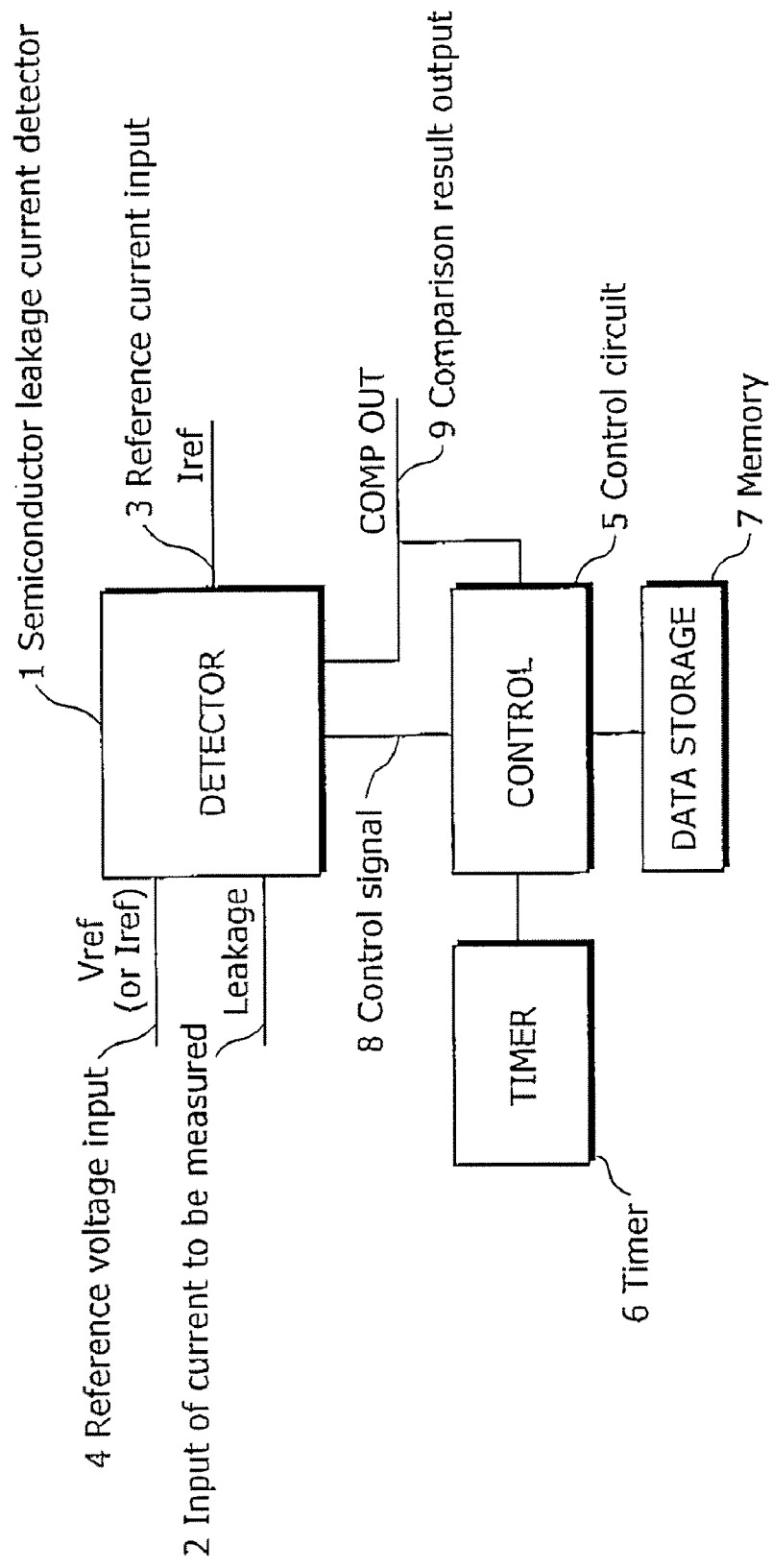
FIG. 1 is a block diagram showing a semiconductor leakage current detector which includes a control unit, a memory, and a timer according to a ninth embodiment.

FIG. 1 is a block diagram showing the semiconductor leakage current detector which includes a control unit, a memory, and a timer according to the ninth embodiment. In FIG. 1, the semiconductor leakage current detector 1 described in the first embodiment includes: a reference voltage input 4 connected to the reference voltage input of a comparator, an input of a current to be measured 2 inputted to the integral capacitor, and a comparison result output 9 which is a reference current input 3 inputted to the integral capacitor and the output result of the comparator.

The reference voltage input 4 is supplied from the band gap reference voltage source of the semiconductor integrated circuit which includes the semiconductor leakage current detector.

The control circuit 5 controls the integration operation by referring to the comparison result of the semiconductor leakage current detector in the time measured by the timer 6. The control circuit 5 executes the calibration operation described in the first embodiment, and stores the obtained integral time into the memory 7. Furthermore, the control circuit 5 executes the test operation described in the first embodiment. In the test operation, the integral value stored in the memory 7 is loaded as an initial value into the timer 6, the timer 6 is operated for count down, the integral operation is executed until the count value reaches the initial value, and the leakage current is then determined.

Note that, whereas it was described that the timer is operated for count down in the present embodiment, it is obvious that the counter (timer as a counter) may be count-up operated.

In the ninth embodiment, a memory and a counter for storing an integral value are defined as minimum constituents necessary for executing the measurement algorithm of the semiconductor leakage current detector, and an on-chip self test of the leakage current is realized. Furthermore, in the case where the reference voltage source is placed in the semiconductor leakage current detector, the reference voltage source can be commonly used so that the semiconductor leakage current detector can be manufactured in a smaller area.

Tenth Embodiment

Figure 2:
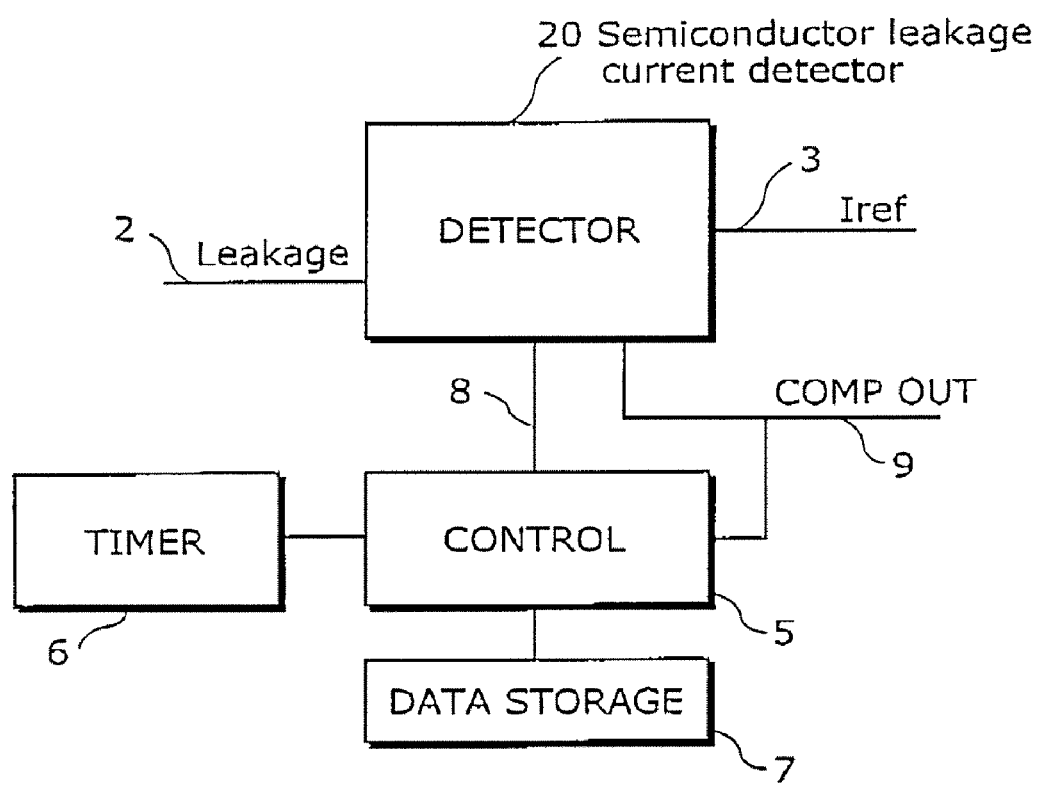
FIG. 2 is a schematic circuit diagram of a semiconductor leakage detector according to a tenth embodiment.

FIG. 2 is a block diagram showing the semiconductor leakage current detector according to the tenth embodiment. This semiconductor leakage current detector further includes the reference voltage source in the detector 20 compared to the configuration of the semiconductor leakage current detector of the ninth embodiment shown in FIG. 1. In FIG. 2, since the semiconductor leakage current detector 20 includes a specific reference voltage source, it does not have the reference voltage input 4. By including the reference voltage source within the semiconductor leakage current detector, a reference voltage can be set in a greater range and a reference voltage source of arbitral temperature characteristics, which are different from the temperature characteristics required for the common reference voltage source, can be included so that a reference voltage is applicable to the leakage current characteristics.

Eleventh Embodiment

Figure 12:
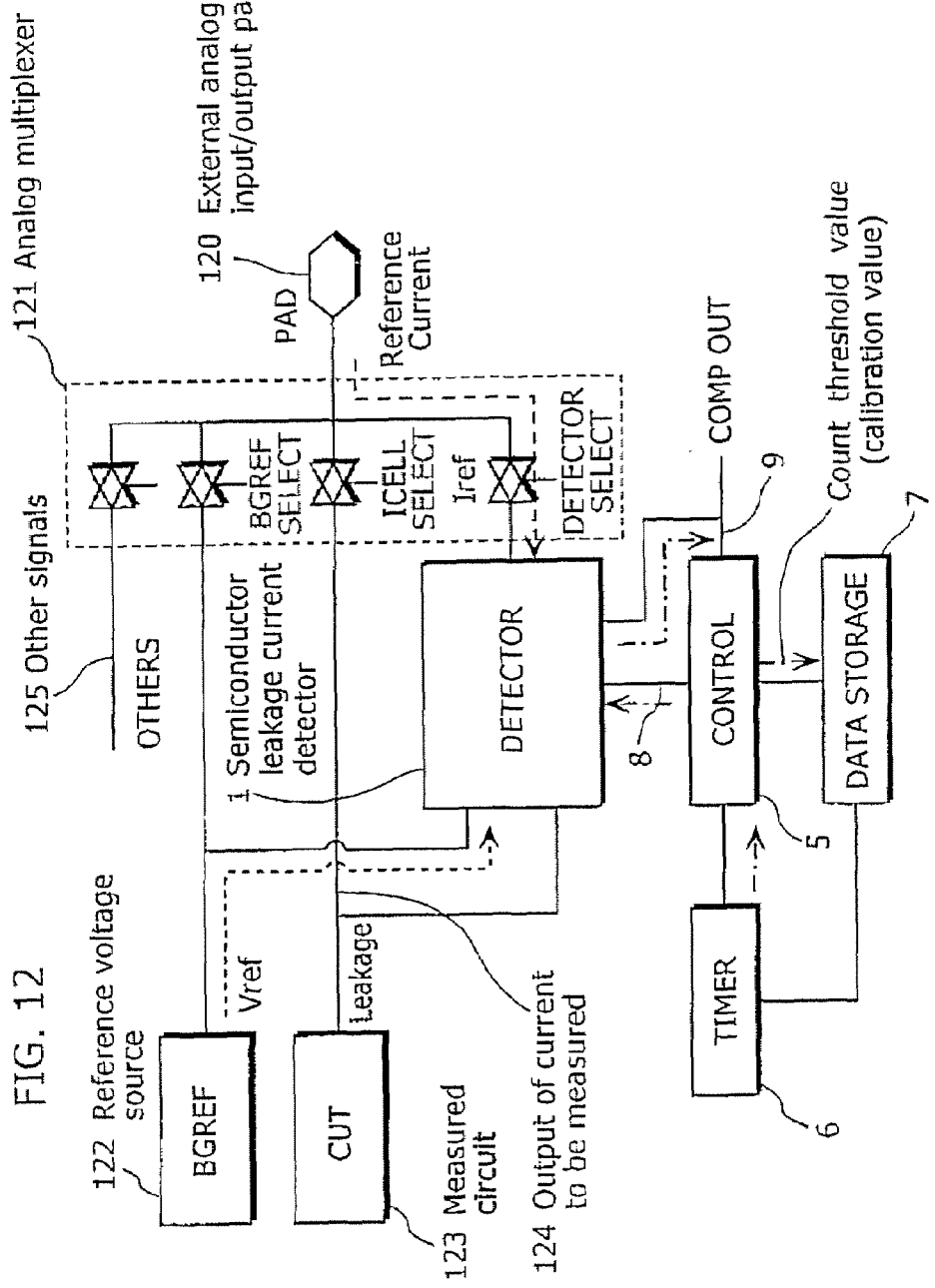
FIG. 12 is a partial block diagram showing a semiconductor integrated circuit according to an eleventh embodiment.

FIG. 12 is a partial block diagram of the semiconductor integrated circuit according to the eleventh embodiment. In FIG. 12, the semiconductor integrated circuit adds an external analog input/output pad 120 connected to an analog multiplexer 121, to the semiconductor leakage current detector 1 described in the ninth embodiment. The external analog multiplexer 121 connects, to the external analog input/output pad 120, one of a reference current input of the semiconductor leakage current detector 1, a reference voltage source 122, an output current to be measured 124, and other signals 125 such as an internal voltage source and the like. The reference voltage source 122 and the output current to be measured 124 are connected to the semiconductor leakage current detector 1.

With this configuration, a single external analog input/output pad can monitor the output currents to be measured such as a cell current and a bit line leakage current, a reference voltage source, and other voltage sources, when the semiconductor integrated circuit is tested.

Figure 13:
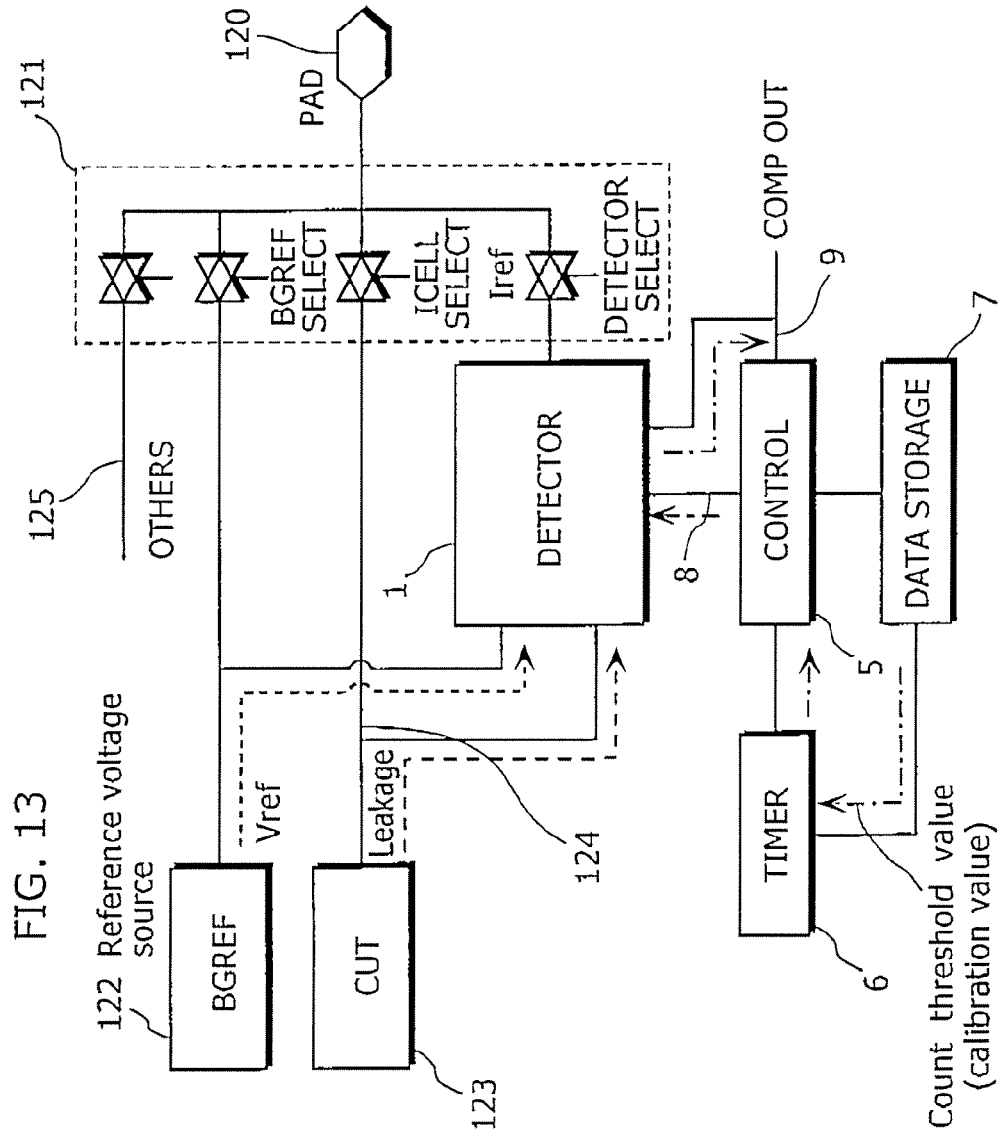
FIG. 13 is an explanatory diagram of an operation of the semiconductor leakage current detector.

Next, the operation of the semiconductor leakage current detector shall be described with references to FIG. 12 and FIG. 13. In FIG. 12, dashed lines indicate a flow of signals in the calibration operation. FIG. 13 is a partial block diagram similar to FIG. 12 and shows the semiconductor integrated circuit according to the eleventh embodiment. In FIG. 13, dashed lines indicate a flow of signals in the test operation. In the calibration operation shown in FIG. 12, a semiconductor leakage current detector 1 is supplied with the reference current via the analog multiplexer 121, and with the reference voltage from the reference voltage source. The control circuit 5 controls start and stop of the integral operation of the reference current which flows in the semiconductor leakage current detector 1, with reference to the comparison result output 9. The integral time is controlled by the timer 6. The control circuit 5 stores, into the memory 7, a count threshold value which is obtained by timer count value 1 at the time when the comparison output is transferred, as an integral value. Next, the test operation shown in FIG. 13 is described. The output current to be measured 124 and the output of the reference voltage source 122 are connected to the semiconductor leakage current detector 1. The analog multiplexer 121 is in a state where the reference current input of the semiconductor leakage current detector 1 is activated or a state in which nothing has been activated. The control circuit 5 stores, into the timer 6, a count threshold value stored in the memory 7, the current to be measured such as a bit line leakage current and the like until the count value of the timer 6 reaches the count threshold value, and outputs the comparison result 9 when the integration is ended.

In the eleventh embodiment, a small scaled semiconductor integrated circuit with a high functional testability can be provided by effectively utilizing the single analog test pad for an internal current/voltage measurement, an external voltage application, a reference current application to the semiconductor leakage current detector.

Twelfth Embodiment

Figure 14:
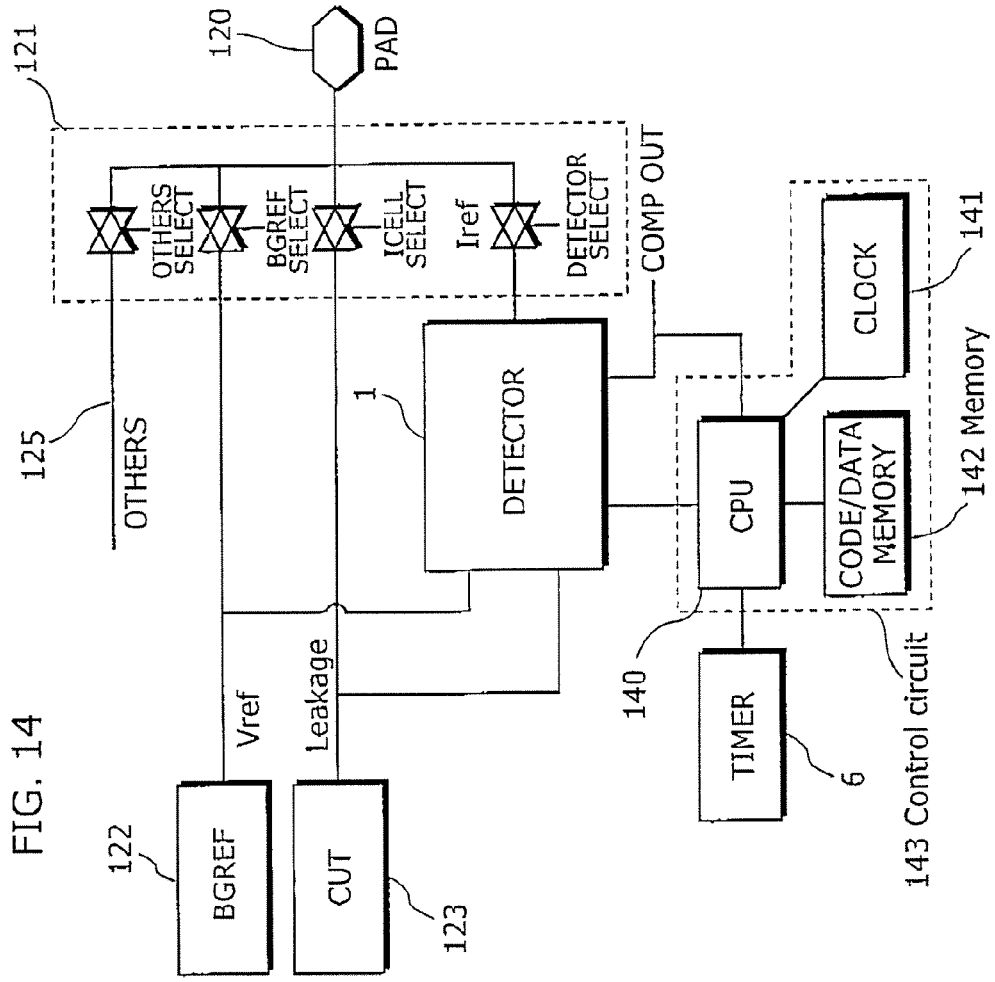
FIG. 14 is a partial block diagram of the semiconductor integrated circuit according to a twelfth embodiment.

FIG. 14 is a partial block diagram of a semiconductor integrated circuit according to the twelfth embodiment. In this diagram, the semiconductor integrated circuit is different from the one shown in FIG. 12 in that a control circuit 143 is included instead of the control circuit 5 and the memory 7. In the following, differences are mainly discussed, omitting the descriptions about the same constituents.

The control circuit 143 is an example of a circuit having the same functions as the control circuit 5 and the memory 7, and includes a CPU 140, a clock 141, and a memory 142. The CPU 140 controls the calibration operation and the test operation. The clock 141 generates operation clocks of the CPU 140 and the timer 6. The memory 142 stores data and program codes (micro codes) which describe algorithms for the calibration operation and the test operation. The hardware which corresponds to the CPU 140, clock 141, memory 142, and timer 6 is usually built in the semiconductor integrated circuit such as a flash memory and the like, for executing rewrite, read-out, and deletion of a memory cell. In this case, the CPU 140, clock 141, memory 142 and timer 6 can be used together with the hardware which is usually built in the semiconductor integrated circuit. In the operation of the semiconductor leakage current detector, the CPU 140 processes, as software, the feedback loop of the output result obtained by the comparator as described below, so that design modification regarding functional changes are no longer necessary or are reduced at minimum. In addition, the operational algorithm can be easily updated. Therefore, a high-performance semiconductor leak detector can be realized with a small area.

Figure 22:
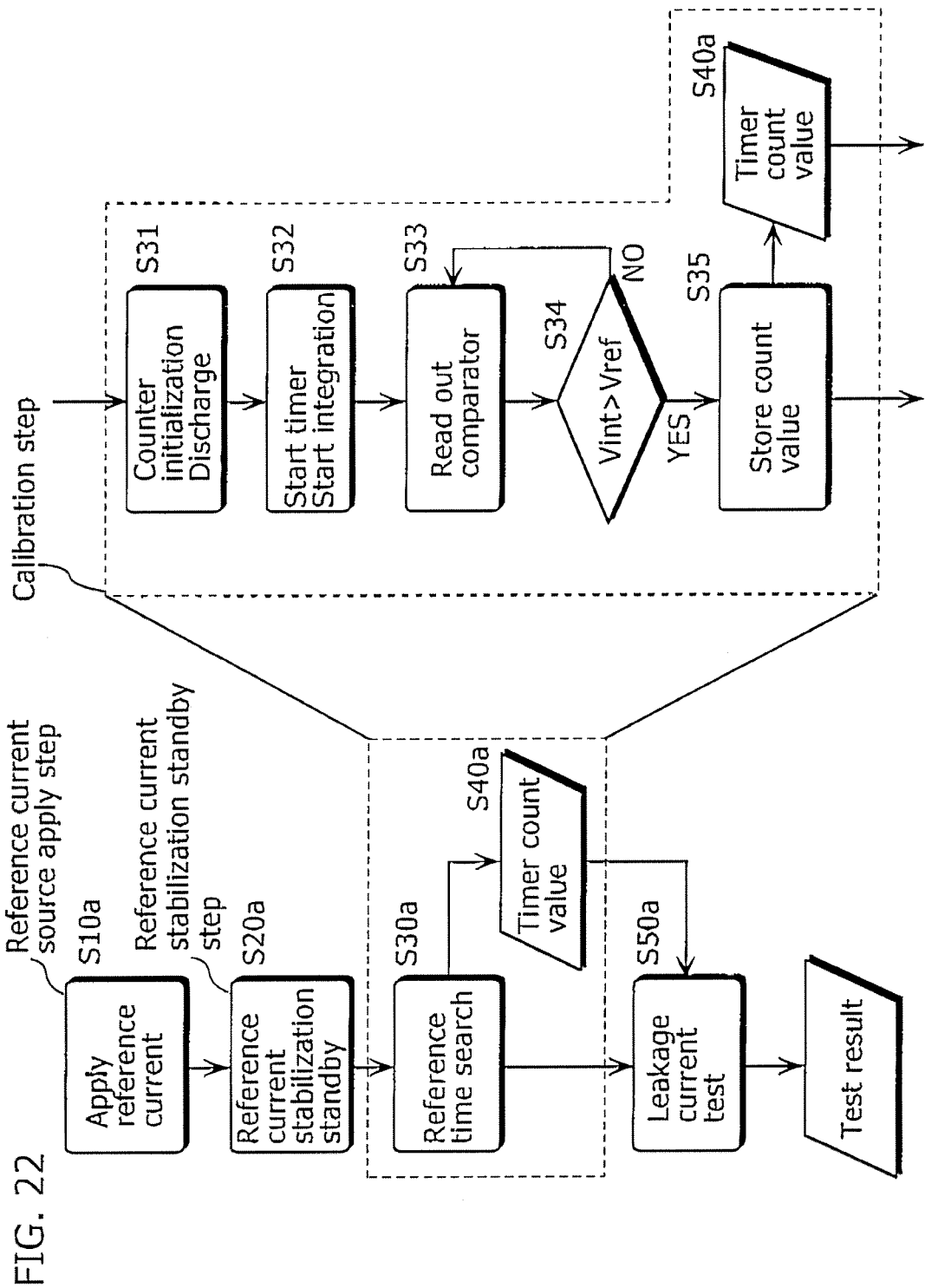
FIG. 22 is a flowchart showing details of a calibration operation.
Figure 23:
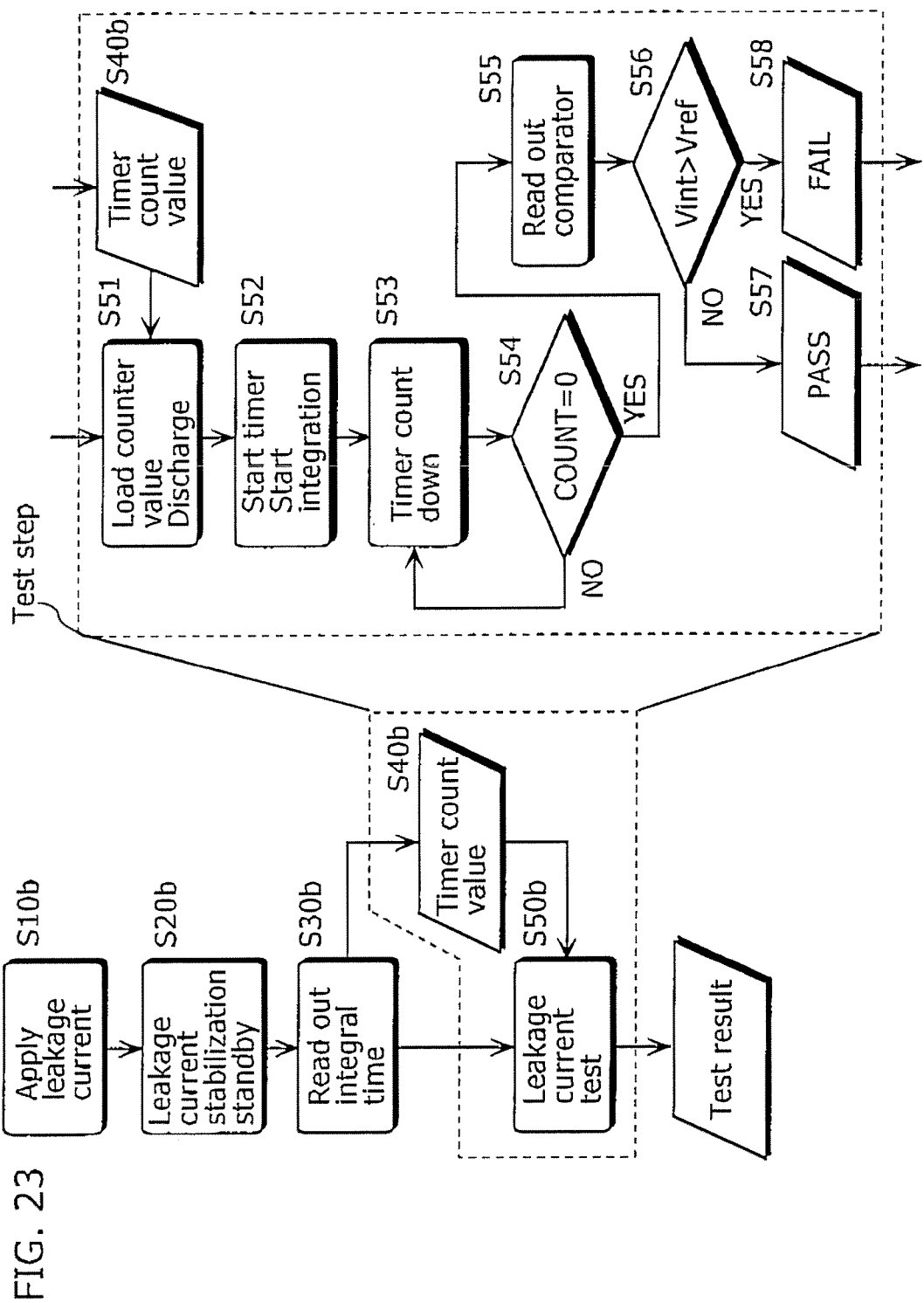
FIG. 23 is a flowchart showing details of a test operation.

FIG. 22 and FIG. 23 are flowcharts, respectively showing details of the calibration operation and the test operation performed by the semiconductor leakage current detector under the control by the control circuit 143. The left side of FIG. 22 shows an entire operation of determining whether or not the current to be measured is greater than the reference current, and the right side of FIG. 22 shows details of the calibration operation.

As shown in the left side of FIG. 22, the control circuit 143 sequentially executes a reference current apply step, a reference current stabilization standby step, a calibration step, and a test step (S10a to S50a). Specifically, the control circuit 143 externally receives a directive to transfer to the test mode; when the reference current is supplied from the external pad in the test mode (S10a), is put on standby until the stable current which charges up the parasitic capacitor of the external pad is supplied to the semiconductor leakage current detector (S20a); executes the reference integral time search step (S30a); writes, into a memory 142, a count value of the timer 6 as an integral time which is a duration required for the inversion of the comparison output obtained by the comparator 30 (S40a); executes the test step (S50a).

As shown in the right side of FIG. 22, the control circuit 143 sequentially executes, as the calibration steps (S30a, S40a), a counter/integral capacitor initialization step, a timer/integration start step, a comparator readout loop, and a count value storage step of the timer (S31 to S40a) Specifically, the control circuit 143 firstly controls initialization of the counter and discharging of the integral capacitor (S31), starts the counting of timer and the discharging of the integral capacitor (S32), periodically reads out a comparator output in the comparator readout loop during the counting by the counter and the discharging of the integral capacitor (S33), stops the counter so as to be out from the loop when the comparator output is inverted, specifically when the integral value input voltage Vint and the reference voltage Vref satisfy Vint>Vref (Yes in S34), and stores the count value into the memory 142 as an integral time required for the comparison output of the comparator 30 to be inverted (S35, S40a).

In the right side of FIG. 23, the control circuit 143 sequentially executes, as test steps (S40b, S50b), a counter load/integral capacitor initialization step, a timer countdown/integration start step, a timer countdown loop, and a comparator readout determination step (S51 to S58). Specifically, the control circuit 143 executes loading of the count value stored in the count value storage step performed by the timer, and discharging of the integral capacitor (S51), starts simultaneously counting down the timer and charging the integral capacitor (S52), executes the countdown and charging operation of the integral capacitor in the timer countdown loop (S53), and gets out of the loop when the countdown value of the timer reaches a predetermined value (for example, 0) (Yes in S54). Furthermore, the control circuit 143 reads out the comparator output (S55), and determines whether or not the current to be measured is greater than the reference current in accordance with the comparator output (S56). In this determination, the control circuit 143 determines that the current to be measured is smaller than the reference current (S57) when the readout comparator output is not inverted, specifically when the integral value voltage Vint and the reference voltage Vref do not satisfy Vint>Vref. In this case, the current to be measured passes the test. Furthermore, the control circuit 143 determines that the current to be measured is greater than the reference current (S58) when the readout comparator output is inverted, specifically when Vint>Vref is satisfied (S58). In this case, the current to be measured fails to pass the test.

As described above, the semiconductor integrated circuit according to the present embodiment implements a semiconductor leakage current detector, and can realizes a self test by utilizing built-in CPU, memory, timer and the like. In addition, a highly accurate determination of a leakage current can be realized at high speed at the software level of the internal CPU.

Thirteenth Embodiment

Figure 15:
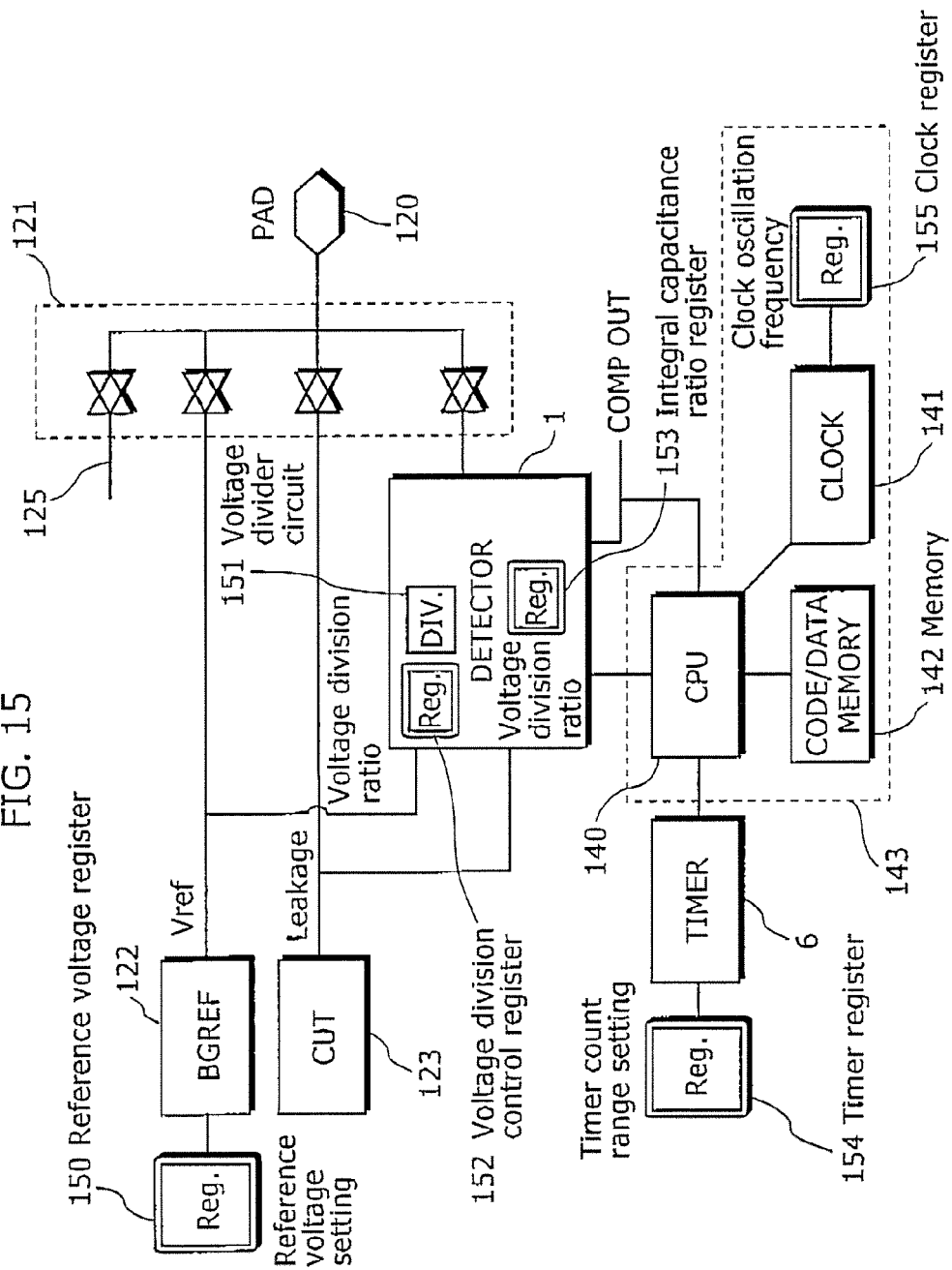
FIG. 15 is a block diagram showing a main unit of a semiconductor integrated circuit according to a thirteenth embodiment.

In the present embodiment, it shall be described a semiconductor device having a semiconductor leakage current detector with a function of trimming reference voltage and the like, FIG. 15 is a block diagram showing a main unit of the semiconductor integrated circuit having a semiconductor leakage current detector with a trimming function according to the thirteenth embodiment. The configuration of the semiconductor integrated circuit in FIG. 15 is different from the one shown in FIG. 14 in that plural registers for trimming and a voltage divider circuit 151 are included, and that an adjustment function using a resister for trimming is added to the control circuit 143. In the following, differences are mainly discussed, omitting the descriptions about the same constituents.

The plural registers for trimming includes a reference voltage register 150, a voltage division control register 152, an integral capacitance ratio register 153, a timer register 154, and a clock register 155.

The reference voltage register 150 holds data for setting a reference voltage of the reference voltage source 122. The reference voltage outputted from the reference voltage source 122 is a voltage value based on this data. The voltage division control register 152 holds data for setting a voltage division ratio for the voltage divider circuit 151. The integral capacitance ratio register 153 holds data for setting a capacitance value for the integral capacitor 34. The integral capacitor 34 has a capacitance of the capacitance value in accordance with the capacitance ratio indicated by this data. The timer register 154 holds data for setting the number of stages (bit length) of the timer 6. The number of stages indicated by this data is valid among the total number of stages for the timer 6. The clock register 155 holds data for setting an oscillatory frequency for the clock 141. The oscillatory frequency of the clock 41 is determined based on this data.

The voltage divider circuit 151 divides the reference voltage Vref outputted from the reference voltage source 122 at the voltage division ratio indicated by the data stored in the voltage division control register 152, and supplies the divided voltage to the comparator 30.

The control circuit 143 performs fine adjustment on data in each register so that variations at the time of manufacturing each semiconductor integrated circuit are absorbed, using the plural registers for trimming. Furthermore, it previously records a range of data within which the data can be set for each register in accordance with a type of the semiconductor integrated circuit, and sets the data for each register in accordance with the type of the semiconductor integrated circuit. For example, it updates data in the necessary registers and performs calibration again, in the case where calibration is not successfully performed, in the case where the integral time measured for the integral capacitor 34 is very long, or the like.

Accordingly, the semiconductor device of the present embodiment is capable of easily adapting to large scaled changes in the range of a current to be measured by making changes in software used for the control circuit 143.

Fourteenth Embodiment

The present embodiment describes read-out operation of the comparator output in each embodiment.

FIG. 16 describes a temporal development of a voltage inputted to a comparator according to the fourteenth embodiment. In FIG. 16, the horizontal axis indicates time and the vertical axis indicates the input voltage to the comparator. The input voltage indicated by a solid line is On integration voltage Vint, and the input voltage indicated by a dashed line is a reference voltage Vref. The sample clock 166 is inputted to the comparator 30 from the control circuit 143 so as to periodically read out the comparison result obtained by the comparator 30. The inputted sample clock 166 opens a gate into which the reference voltage Vref and the integration voltage Vint are inputted. The comparator output 167 indicates a comparison result obtained by the comparator 30. The actual comparison result is outputted at the timing of the sample clock 166.

The integration voltage Vint indicated by the solid line is 0V during the discharge period 162, increases as the time passes in the integral time 160, and is discharged at 0V during the discharge period 161. Whereas the reference voltage Vref indicated by the dashed line is a constant voltage, noise is superimposed on it being influenced by the pulse of the sample clock 166 as shown in FIG. 16. An error is caused between the timing when the integration voltage Vint becomes actually greater than the reference voltage Vref and the timing when the comparator output 167 is inverted, as shown in the diagram. This is because the control circuit 143 periodically reads out the comparator output 167 at the pulse timing of the sample clock 166.

Therefore, in the present embodiment, the control circuit 143 detects the inverted state of the comparator output 167, obtains a time Tint2 of the sampling pulse immediately before the inversion, and defines the time ranged from the start of the integral time to the time Tint 2 as an integral time Tint required for the inversion.

Note that, as described in the above, it is possible to make a highly accurate determination of a bit line leakage current less than the reference current by detecting the non-inversion state of the comparator output and setting, as the value of Tint, the value immediately after the inversion of the comparator output.

Furthermore, the accuracy can be modified by repeating the calibrations while gradually shifting the phase of the sampling clock. The integral time is obtained by adding an offset, which is equivalent to the phase difference, to the count value of the timer. Note that, a cycle of a sampling clock is determined by software, and the offset can be controlled by a dummy cycle of the CPU and the like. A minimum measurement resolution of the integral time is a clock cycle.

Fifteenth Embodiment

The present embodiment describes a configuration for realizing a self-trimming function by the reference voltage source in order to improve accuracy of the reference voltage.

Figure 17:
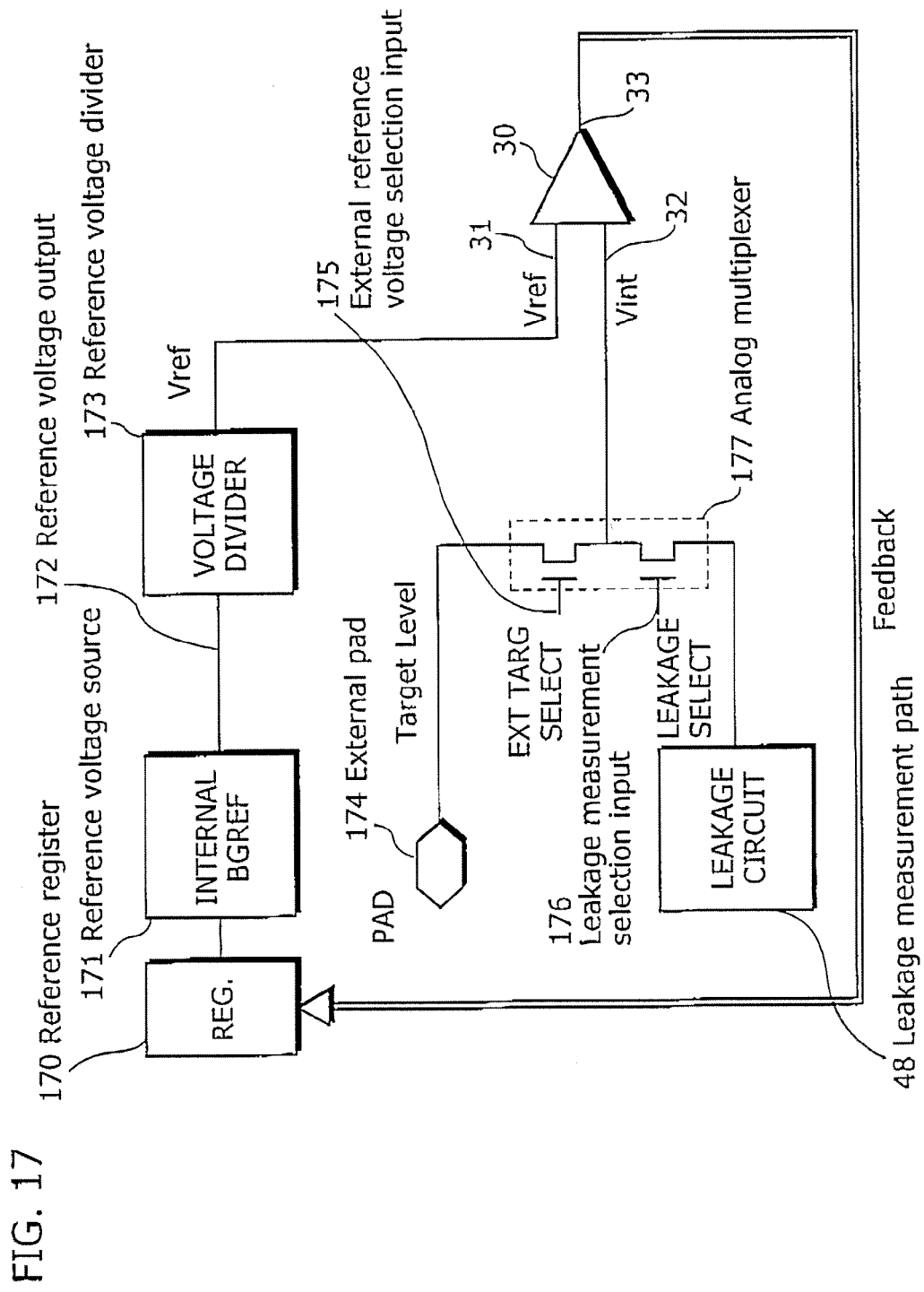
FIG. 17 is a block diagram showing a configuration of a main unit of a semiconductor leakage current detector according to a fifteenth embodiment.

FIG. 17 is a block diagram showing a configuration of a main unit of a semiconductor leakage current detector having a function of adjusting the reference voltage Vref according to the fifteenth embodiment. The semiconductor leakage current detector in the diagram includes: a reference register 170 which holds trimming data; a reference voltage source 171 which generates a constant voltage in accordance with the trimming data; a voltage divider 173 which divides the constant voltage (a reference voltage output 172) outputted by the reference voltage source 172, and outputs, as a reference voltage, the divided constant voltage, to the reference side input 31 of the comparator 30; an external pad 174 for externally inputting a voltage value which is a target level of the reference voltage; and an analog multiplexer 177 which selects one of the leakage measurement path 48 of the current source to be measured and the external pad 174, and connects the selected one to the integral capacitor side input 32 of the comparator 30. The analog multiplexer 177 selects the external pad 174 by the external reference voltage selection input 175 outputted by the control circuit 143, or selects the leakage measurement path by the leak measurement selection input 176.

The control circuit 143 controls the analog multiplexer 177 and the comparator 30 so as to compare the target level inputted via the analog multiplexer 177 from the external pad 174 with the reference voltage from the voltage divider 173, and updates trimming data in the reference register 170 in accordance with the comparison result. Here, the control circuit 143 updates the trimming data in the reference register 170 so that the reference voltage outputted from the voltage divider 173 matches the target level inputted from the external pad 174.

Accordingly, the semiconductor leakage current detector of the present embodiment can realize a self-trimming function of the reference voltage source by a small addition of hardware, and can improve an absolute accuracy of the reference voltage. The semiconductor leakage current detector of the present embodiment can finely adjust the reference voltage at mV order absolute accuracy.

Figure 18:
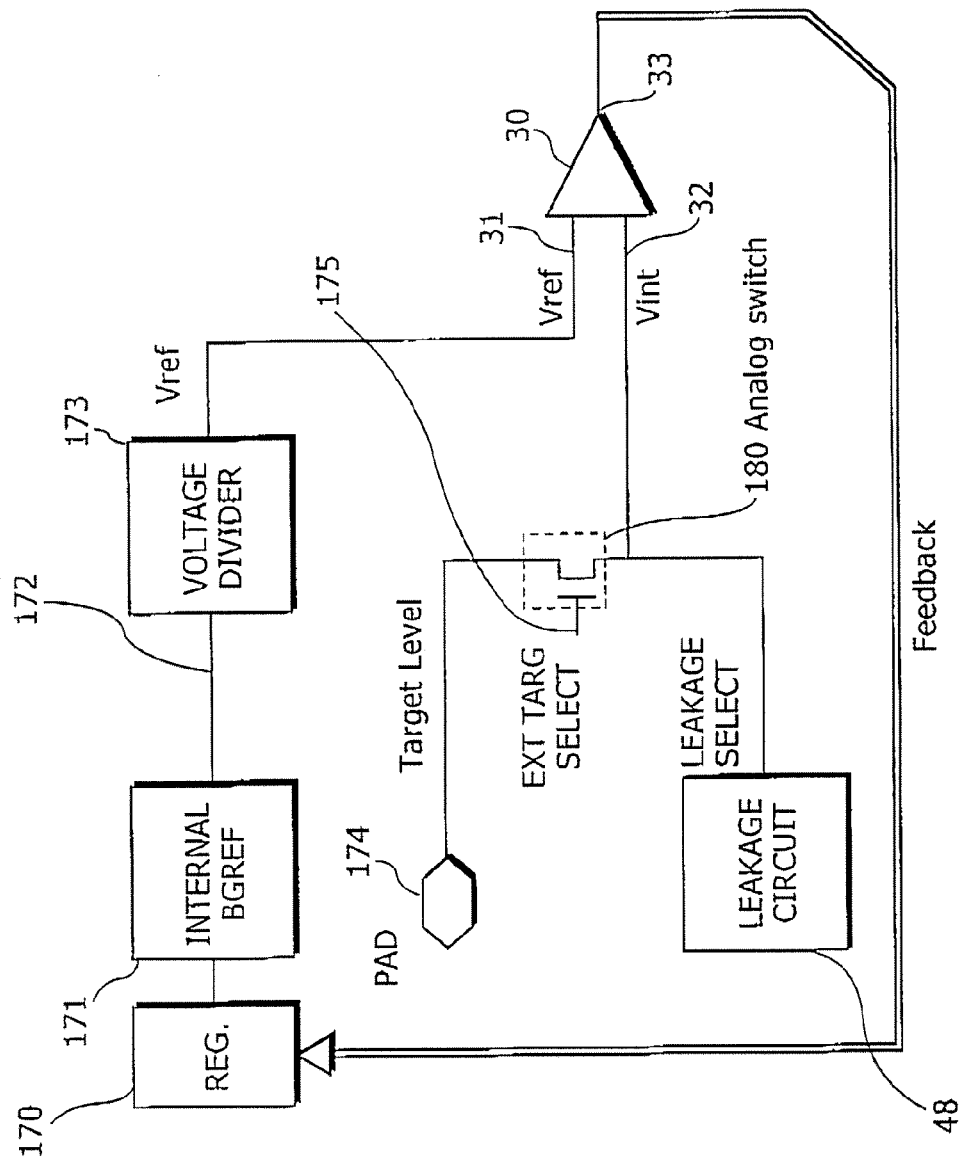
FIG. 18 is a diagram showing a configuration of a variation of the semiconductor leakage current detector.

FIG. 18 is a diagram showing a variation of the configuration of the semiconductor leakage current detector shown in FIG. 17. The configuration shown in FIG. 18 includes an analog switch 180 instead of the analog multiplexer 177 included in the configuration shown in FIG. 17.

The analog switch 178 is inserted between the external pad 174 and the integral capacitor side input 32 of the comparator 30, and is controlled by the external reference voltage selection input 175. In other words, when the analog switch 178 is being turned on, the target level outputted by the external pad 174 is inputted to the integral capacitor side input 32 of the comparator 30. When the analog switch 178 is being turned off, the current to be measured from the leak measurement path 48 is inputted to the integral capacitor side input 32 of the comparator 30.

The configuration shown in FIG. 18 is different from that of FIG. 17 in that, when the analog switch 178 is being turned on, not only the external pad 174 but also the leakage measurement path 48 are connected to the integral capacitor side input 32. In general, this difference does not cause any problems. The influence of the leakage measurement path 48 on the target level inputted by the external pad 174 can be usually ignored because the stray capacitor of the leakage measurement path 48 is very small compared to the stray capacitor of the external pad 174, or when the leakage current, which is as much as several μA, is sufficiently smaller than the current driving performance of the external pad. Whereas abnormalities such as a short in wiring in the leakage measurement path 48 cannot be ignored, one or more leakage measurement path 48 is selected out of plural bit lines so that other bit line can be selected even when the abnormalities are found. Therefore, the configuration shown in FIG. 18 is sufficiently useful for a practical use. Accordingly, the configuration shown in FIG. 18 allows a fine adjustment of accuracy of a reference voltage by only adding a circuit which is simpler than the configuration shown in FIG. 17.

Sixteenth Embodiment

The present embodiment describes a semiconductor leakage current detector by which absolute accuracy of the reference voltage is further increased.

Figure 19:
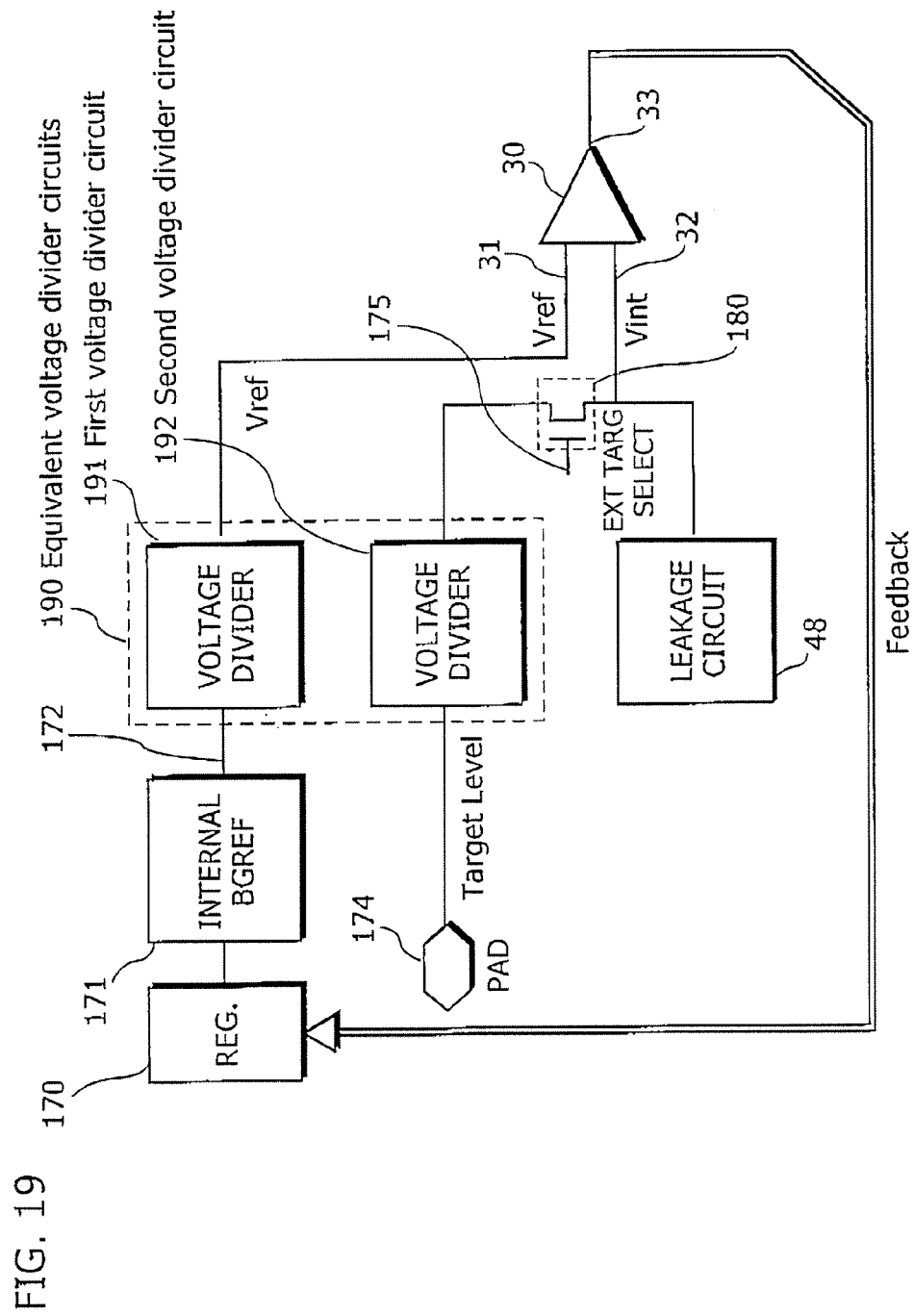
FIG. 19 is a block diagram showing a configuration of a main unit of a semiconductor leakage current detector according to a sixteenth embodiment.

FIG. 19 is a block diagram showing a configuration of a main unit of a semiconductor leakage current detector having a function 65 of finely adjusting the reference voltage Vref according to the sixteenth embodiment. In FIG. 19, two equivalent voltage divider circuits 190 are included instead of the voltage divider 173, compared to the configuration shown in FIG. 17. In the following, differences are mainly discussed, omitting the descriptions about the same constituents.

The equivalent voltage divider circuits 190 are a first voltage divider circuit 191 and a second voltage divider circuit 192. The first voltage divider circuit 191 is the same as the voltage divider 173. The second voltage divider circuit 192 divides the constant voltage inputted by the external pad 174, and outputs the divided constant voltage as a target level to the integral capacitor side input 32 of the comparator 30 via the analog switch 180.

The first and second voltage divider circuits 191 and 192 are manufactured using the same circuit layout pattern.

Accordingly, differences of the voltage divider circuits in respective chips generated when the chips are manufactured can be cancelled within a single chip. In other words, both the reference voltage output 172 and the constant voltage outputted by the external pad 174 are divided based on the same characteristics so that an absolute accuracy of the voltage divider circuit is not required. Therefore, the accuracy of fine adjustment of the reference voltage can be further improved.

Seventeenth Embodiment

The present embodiment describes a semiconductor leakage current detector which increases the speed of raising the reference voltage when the power is applied and which can use the reference voltage to other circuits.

Figure 20:
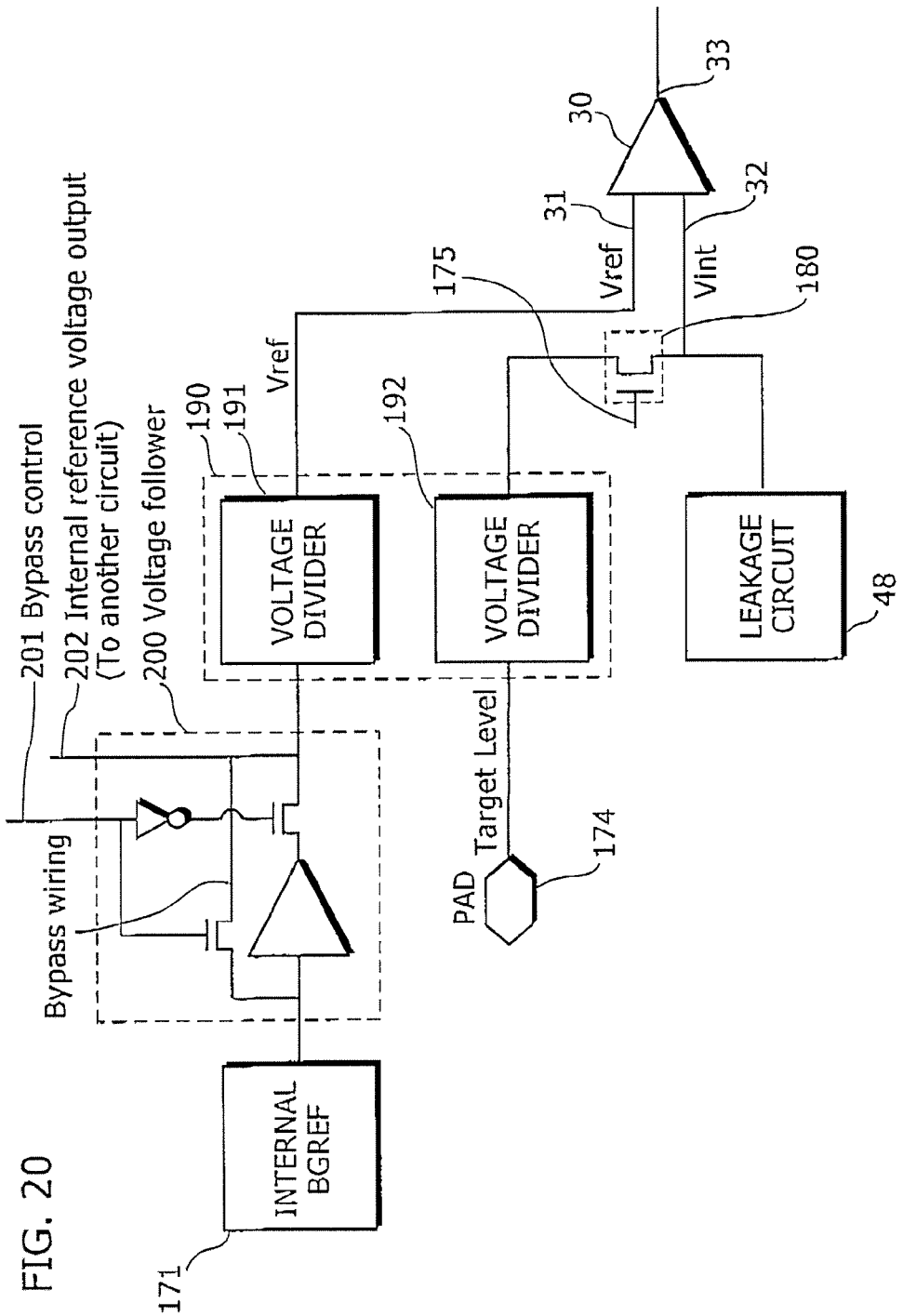
FIG. 20 is a block diagram showing a configuration of a main unit of a semiconductor leakage current detector according to a seventeenth embodiment.

FIG. 20 is a block diagram showing a configuration of the main unit of a semiconductor leakage current detector according to the seventeenth embodiment. Compared to the configuration shown in FIG. 19, the voltage follower circuit 200 is added in FIG. 20. In the following, differences are mainly discussed, omitting the descriptions about the same constituents.

The voltage follower circuit 200 is connected to between the reference voltage source 171 and the first voltage divider circuit 191, and includes a voltage follower amplifier, a bypass wiring which bypasses the voltage follower, and a switch circuit which selects one of the voltage follower and the bypass wiring. The voltage follower is a buffer for driving a current of the constant voltage signal outputted by the reference voltage source 171. The bypass wiring is a wiring for inputting the low voltage outputted by the reference voltage source 171 directly to the voltage divider circuit 191. The switch circuit selects one of the voltage follower and the bypass wiring.

The switch circuit selects the voltage follower when the power is turned on. This selection shortens the start-up time necessary for the reference voltage Vref to be stable. The switch circuit also selects the voltage follower during the trimming of the reference voltage. This selection allows decreasing the errors caused by the decrease in the reference voltage during the trimming of the reference voltage. Furthermore, the output from the voltage follower or the reference voltage source 171 is used for other circuits in the semiconductor integrated circuit. Here, lower power consumption can be realized by turning the voltage follower off with the selection of the bypass wiring.

As described in the above, the semiconductor leakage current detector of the present embodiment can realize a high-speed rising of the reference voltage when the power of the semiconductor integrated circuit is turned on, while decreasing the differences caused by the decrease in the reference voltage during the trimming of the reference voltage.

Eighteenth Embodiment

The present embodiment describes a semiconductor leakage current detector which cancels the influence of the input offset in the comparator 30 by mutually changing the input of the comparator 30.

Figure 21:
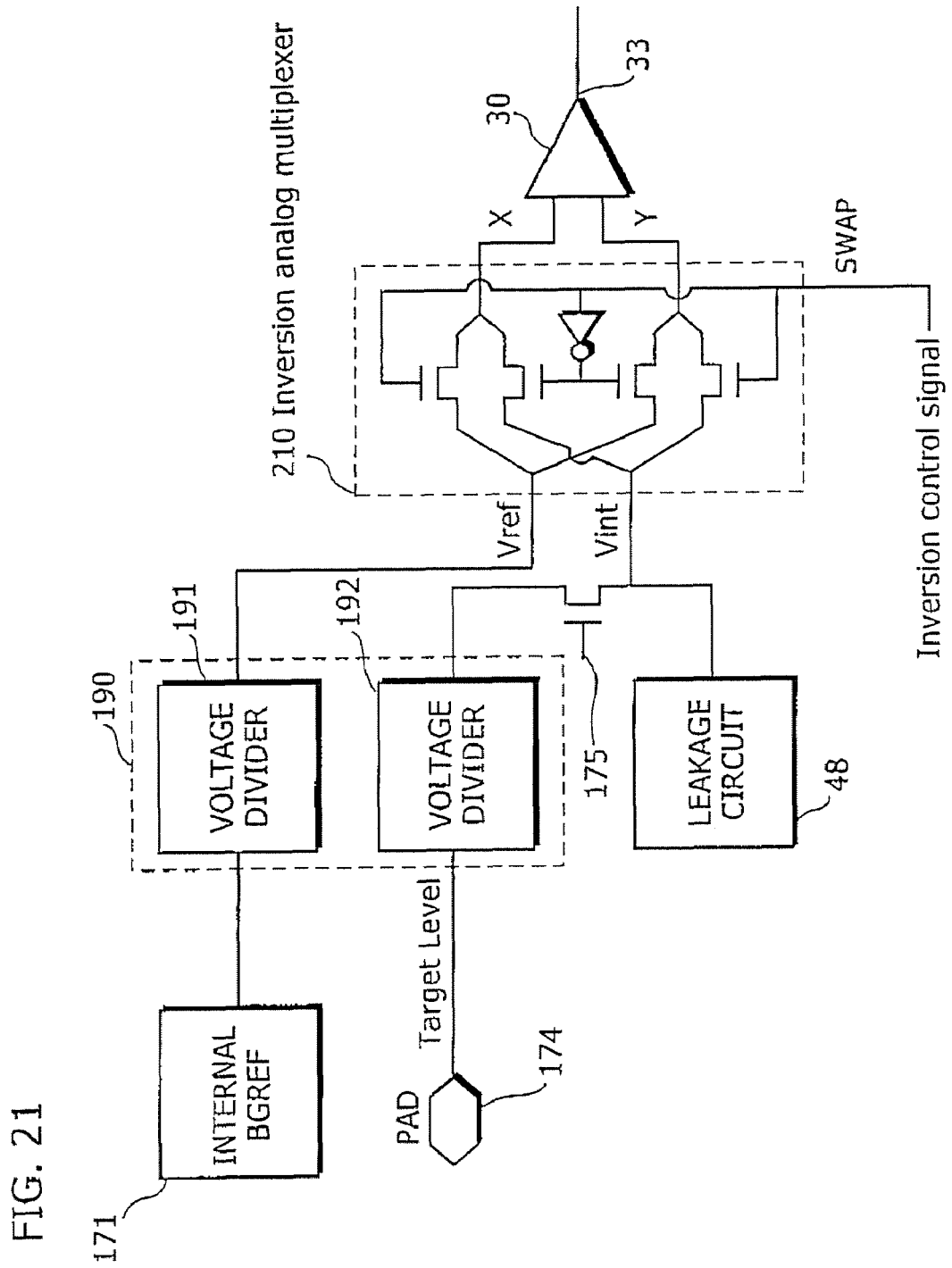
FIG. 21 is a block diagram showing a main unit of a semiconductor leakage current detector according to an eighteenth embodiment.

FIG. 21 is a block diagram showing a main unit of the semiconductor leakage current detector having an input inversion function of a comparator according to the eighteenth embodiment. In FIG. 21, the inversion analog multiplexer 210 is included, compared to the configuration shown in FIG. 19. In the following, differences are mainly discussed, omitting the descriptions about the same constituents.

The inversion analog multiplexer 210 inverts (switches) two inputs to the comparator 30. Specifically, it switches the inputs between (Vref, Vint) and (Vint, Vref) to the input terminal (X, Y) of the comparator 30. The inversion of two inputs performed by the inversion analog multiplexer 210 is used for trimming the reference voltage.

Figure 24:
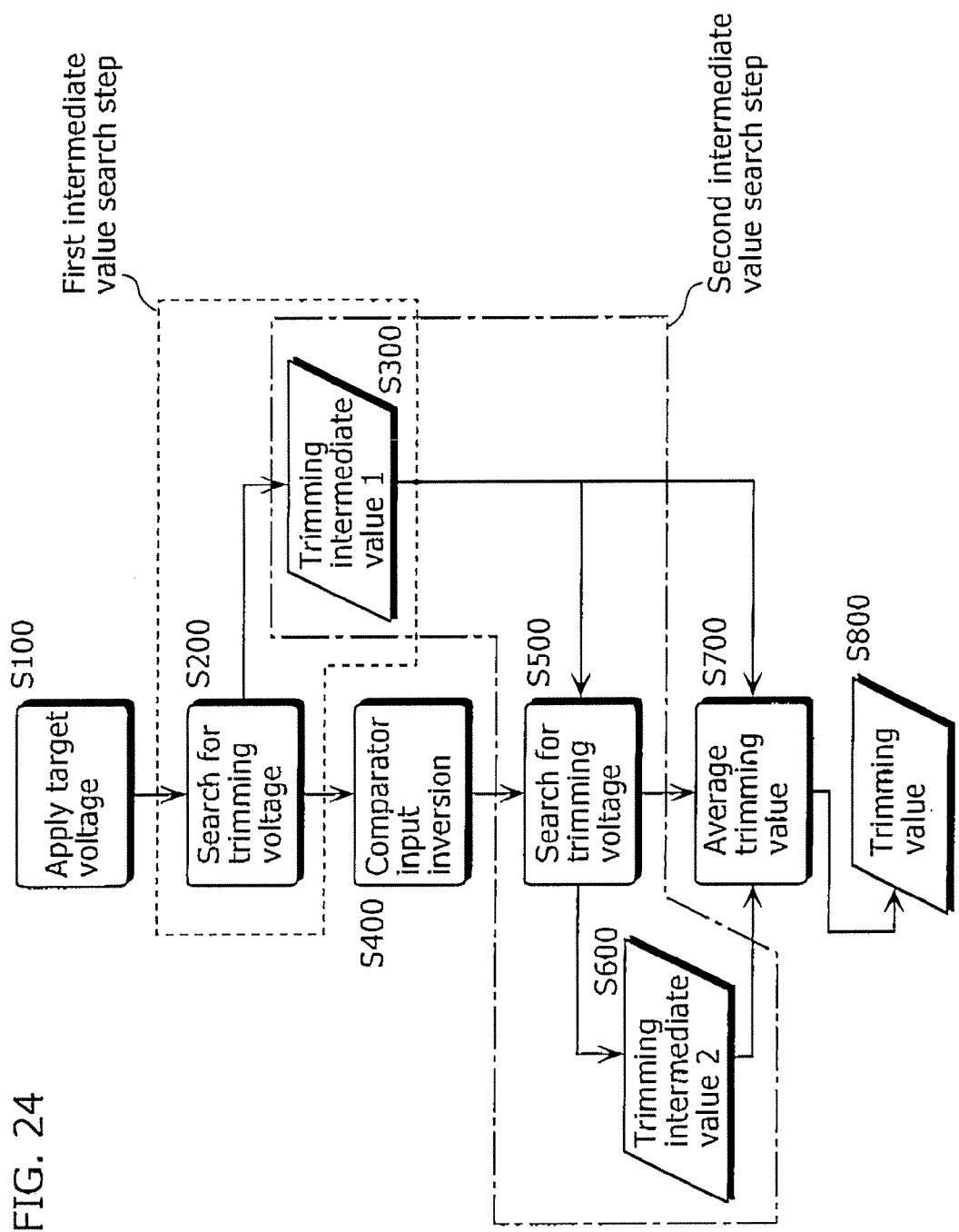
FIG. 24 is a flowchart showing a trimming processing.

FIG. 24 is a flowchart showing an example of a trimming process performed by the semiconductor leakage current detector having the input inversion function. This trimming process is a process of finely adjusting the absolute accuracy of the reference voltage Vref. As shown in FIG. 24, the control circuit 143 sequentially executes a target voltage apply step, a first intermediate value search step, a comparator input inversion step, a second intermediate value search step, and a trimming value average step (S100 to S800). Specifically, when a setting value (a target level) of the reference voltage is given by the external pad (S100), the control circuit 143 obtains, in the first intermediate search step, a trimming intermediate value 1, which is a boundary value of the reference voltage Vref when the comparison output 33 outputted from the comparator 30 is inverted (S200, S300). The control circuit 143 further changes the output to the inversion analog multiplexer 210 (S400), and obtains, in the second intermediate search step, a trimming intermediate value 2, which is a boundary value of the reference voltage Vref when the comparison output 33 of the comparator 30 is inverted (S500, S600). After that, the control circuit 143 takes an average of the trimming intermediate values 1 and 2 (S700), and sets the obtained average value at the reference register as a final trimming value of the reference voltage (S800).

Figure 25:
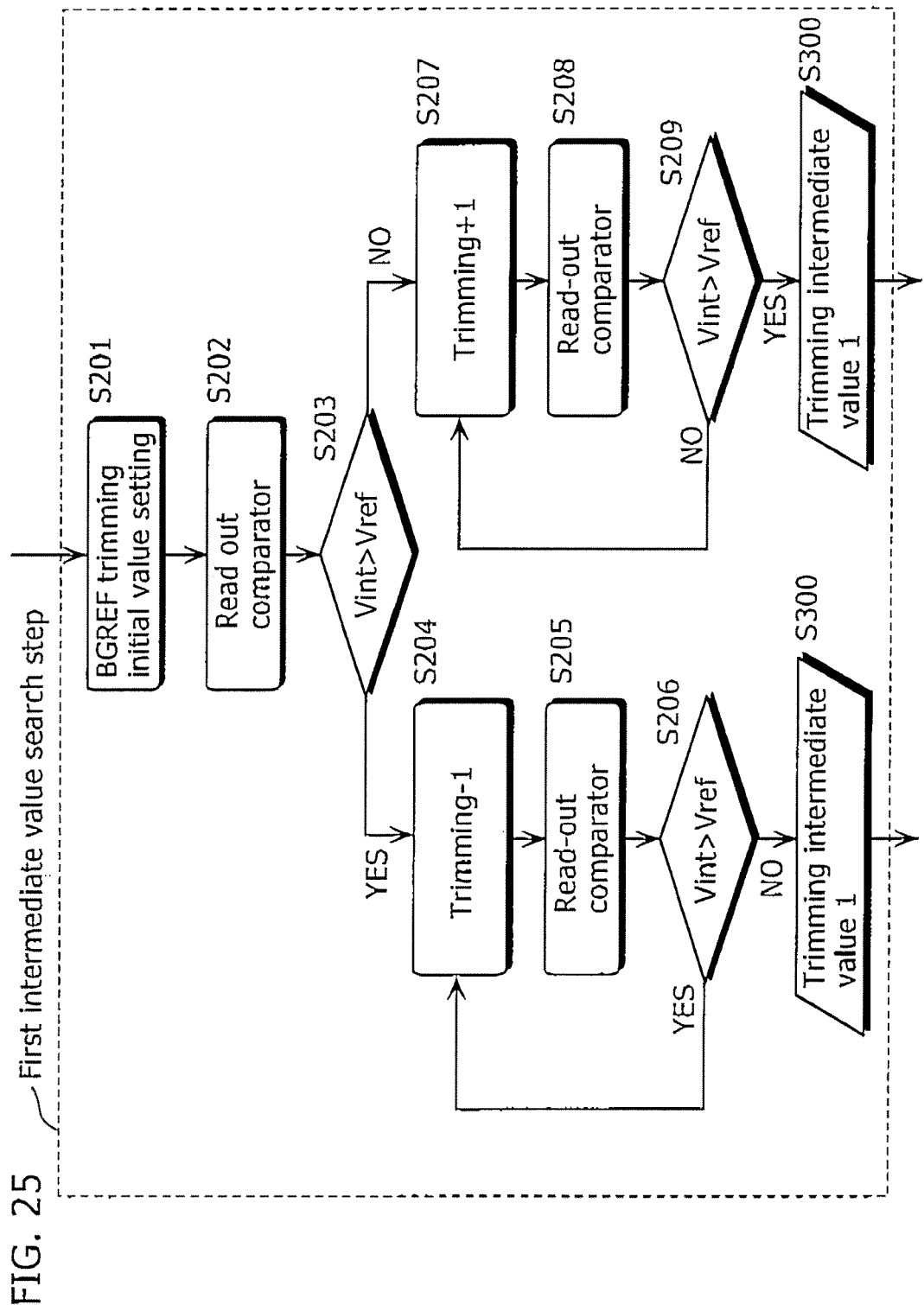
FIG. 25 is a flowchart showing details of a first intermediate value search step in FIG. 24.

FIG. 25 is a flowchart showing a detailed example of the first intermediate search step (S200, S300) shown in FIG. 24. The control circuit 143 sequentially executes, as the first intermediate value search step, a trimming initial value setting step, a comparator read-out step, and a trimming loop (S201 to S300). Specifically, the control circuit 143 sets, in the trimming initial value setting step, an initial value at the reference voltage register for controlling an output level of the reference voltage (S201), reads out the comparator output in the comparator read-out step (S202), determines whether or not voltage Vint which is proportional to the voltage of the external pad is greater than the voltage Vref which is proportional to the reference voltage (S203), and executes one of the following two trimming loops in accordance with the determination result.

When the determination result shows Vint>Vref, in the trimming loop shown on the left of FIG. 25, the control circuit 143 decreases the reference voltage register one step down to the higher voltage (S204), reads out the comparator output (S205), and repeats the process of the trimming loop until the result Vint<Vref is satisfied (S206). In this operation of the trimming loop, a trimming value obtained when Vint<Vref is determined as a trimming intermediate value 1 (S300).

Furthermore, when the determination result shows Vint<Vref, in the trimming loop shown on the right of FIG. 25, the control circuit 143 increases the reference voltage register one step up to the higher voltage (S207), reads out the comparator output (S208), and repeats the process of the trimming loop until the result Vint>Vref is satisfied (5209). In this operation of the trimming loop, a trimming value obtained when Vint>Vref is determined as a trimming intermediate value 1 (S300).

Figure 26:
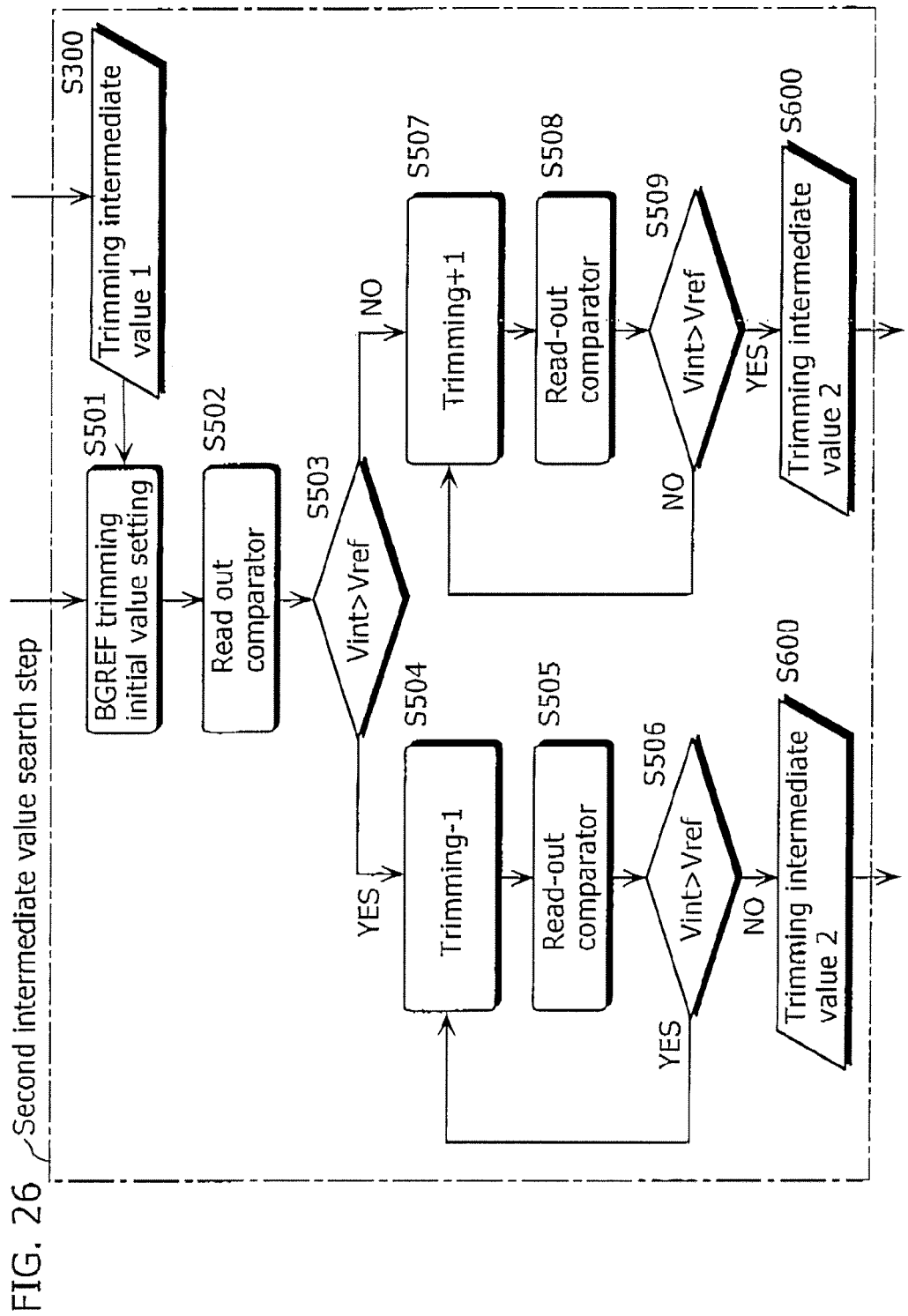
FIG. 26 is a flowchart showing details of a second intermediate value search step in FIG. 24.

FIG. 26 is a flowchart showing a detailed example of the second intermediate value search step in FIG. 24. The flowchart shown in FIG. 26 is the same as the flowchart shown in FIG. 25 except that the trimming intermediate value 1 is set at the reference voltage register in the trimming initial value setting step (S501), and that the trimming intermediate value 2 is finally outputted (S600).

As described in the above, the semiconductor leakage current detector of the present embodiment obtains trimming values of before and after the switching of inputs of the comparator, and uses the average value of the trimming values. Therefore, the influence of the input offset of the comparator can be removed and trimming can be realized at high speed shortening the trimming search time. Since the influence of the offset on the comparator 30 can be completely removed and an inexpensive small comparator with large offset can be used.

Note that, whereas a linear search is used as an algorithm for a trimming loop in the present embodiment, it is obvious that binary search and the like may be used to further speed up the convergence of loops.

Nineteenth Embodiment

The present embodiment describes a specific example of a semiconductor integrated circuit equipped with the present semiconductor leakage current detector.

Figure 27:
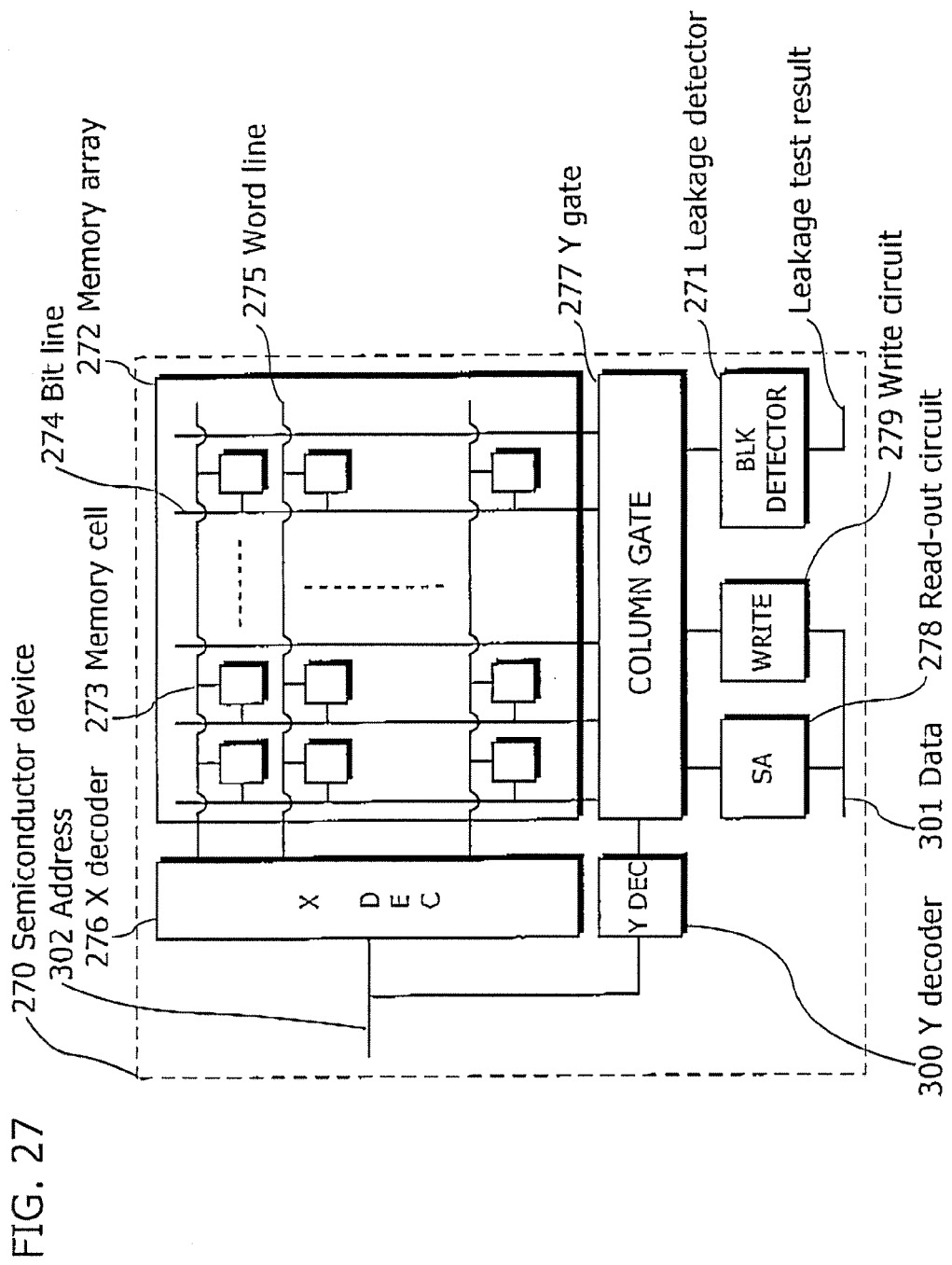
FIG. 27 is a block diagram showing an example of a semiconductor device according to a nineteenth embodiment.

FIG. 27 is a block diagram showing an example of a semiconductor device including the semiconductor leakage current detector according to the nineteenth embodiment. As shown in FIG. 27, a semiconductor device 270 includes a leakage detector 271, a memory cell 273, an X decoder 276, a Y gate 277, a read-out circuit 278, a write circuit 279, and a Y decoder 300. The semiconductor device 270 shows an example of a general flash memory except the leakage detector 271.

When the leak detector 271 determines one or plural bit leakage currents selected from among the plural bit lines when the leak detector 271 is connected the Y gate 277 as shown in the diagram.

Figure 28:
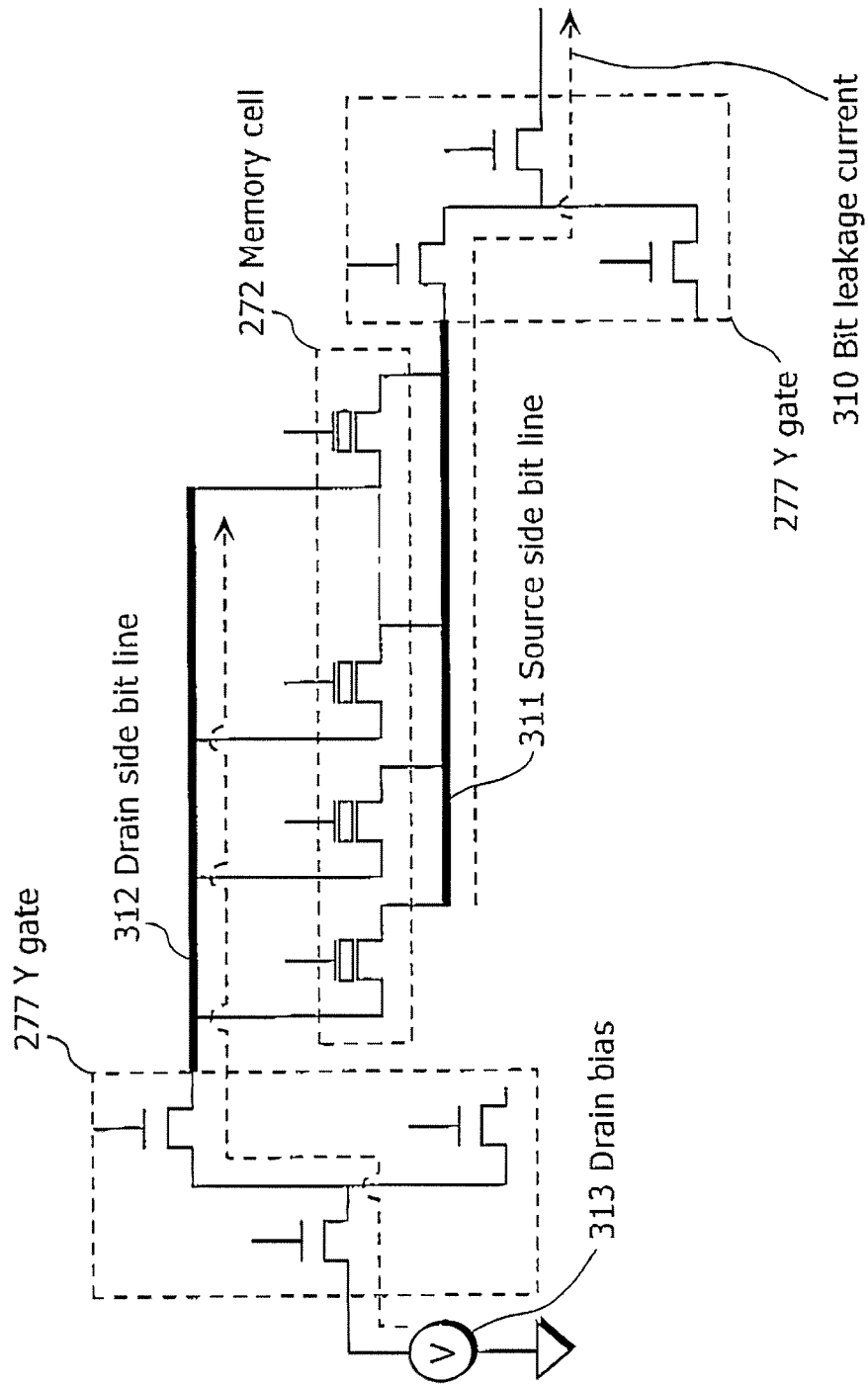
FIG. 28 is an explanatory diagram of a leakage current in bit lines shown in FIG. 27.

FIG. 28 is an explanatory diagram showing a leakage current in the bit lines in FIG. 27. FIG. 28 shows a portion of the Y gate 277 and a portion (for one line) of the memory array 272 shown in FIG. 27. The memory cell shown in FIG. 28 is a nonvolatile memory transistor and adapts a source-side read-out method. At the time of reading, a drain bias is applied to the drain of the memory cell selected by an address from the drain bias 313, and a read-out value is determined based on the current which flows toward the source.

As shown in the dashed lines in the diagram, the bit line leakage current flows from the Y gate 277 towards the drain-side bit line 312 and further flows in the source-side bit line 311 resulting from the drain bias by the drain bias 313. Such bit line leakage current causes erroneous determination of the cell current with an error as much as the leakage current and excess/insufficient writing, and prevents a normal threshold value control of the memory cell. As described in each of the aforementioned embodiments, the leakage detector 271 can perform a highly accurate determination of a small leakage current as much as several µA at high speed.

In the present embodiment, a highly accurate determination of the bit line leakage current can be performed at high speed even in the case of using the source-side read-out method as shown in FIG. 28.

The semiconductor leakage current detector and the semiconductor integrated circuit of the present invention is applicable to a semiconductor device, particularly to a semiconductor device which includes a memory cell array, for example, a nonvolatile memory such as a flash memory, EEPROM, or a ferroelectric memory, and a volatile memory such as a DRAM or a SPRAM.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A semiconductor leakage current detector which determines whether or not a current to be measured is greater than a reference current, said detector comprising:
   a first analog switch which causes the current to be measured to flow or to be cut off;
   a second analog switch which causes the reference current to flow or to be cut off;
   an integral capacitor which is connected to said first analog switch and said second analog switch, and is charged with the current to be measured or the reference current;

a discharge unit operable to discharge said integral capacitor; and a comparison unit operable to compare a reference voltage with each of: an integral voltage generated in said integral capacitor by the reference current after the discharge of said integral capacitor; and an integral voltage generated in said integral capacitor by the current to be measured after the discharge of said integral capacitor.

2. The semiconductor leakage current detector according to claim 1, wherein said comparison unit is operable to perform a first comparison of comparing the reference voltage with the integral voltage generated in said integral capacitor by the reference current after the discharge of said integral capacitor, and a second comparison of comparing the reference voltage with the integral voltage generated in said integral capacitor by the current to be measured after the discharge of said integral capacitor, and said semiconductor leakage current detector is operable to determine whether or not the current to be measured is greater than the reference current, based on outputs of said comparison unit as results of the first and second comparisons.

3. The semiconductor leakage current detector according to claim 2, wherein in the second comparison, it is determined whether or not the current to be measured is greater than the reference current, based on whether or not the output of said comparison unit is inverted when a predetermined time passes after the discharge of said integral capacitor, and the predetermined time is equivalent to a time required for the output of said comparison unit to be inverted in the first comparison.

4. The semiconductor leakage current detector according to claim 3, wherein said comparison unit is a comparator which periodically takes samples and compares the samples, the predetermined time is a time required for said comparison unit to take samples, the time being ranged from after the discharge of said integral capacitor until immediately before the inversion of the output of said comparator in the first comparison, and said semiconductor leakage current detector is operable to determine that the current to be measured is greater than the reference current, in the case where the output of said comparator is inverted when the predetermined time passes after the discharge of said integral capacitor in the second comparison.

5. The semiconductor leakage current detector according to claim 3, wherein said comparison unit is a comparator which periodically takes samples and compares the samples, the predetermined time is a time required for said comparison unit to take samples, the time being ranged from after the discharge of said integral capacitor until immediately after the inversion of the output of said comparator in the first comparison, and said semiconductor leakage current detector is operable to determine that the current to be measured is smaller than the reference current, in the case where the output of said comparator is not inverted when the predetermined time passes after the discharge of said integral capacitor in the second comparison.

6. The semiconductor leakage current detector according to claim 3, wherein the predetermined time is equivalent to n-times as long as the time which is ranged from after the discharge of said integral capacitor until the inversion of the output of said comparator in the first comparison, and said semiconductor leakage current detector is operable to determine that the current to be measured is greater than 1/n of the reference current in the case where the output of said comparator is inverted when the predetermined time passes after the discharge of said integral capacitor in the second comparison.

7. The semiconductor leakage current detector according to claim 2, further comprising:

a compensation capacitor which is connected to a line for the reference current and to an upstream of said second analog switch, and has a capacitance value which corresponds to a capacitor connected to the line for the current to be measured.

8. The semiconductor leakage current detector according to claim 7, wherein said compensation capacitor includes at least one of a metal option unit and a control option unit, the metal option unit is connectable to a wiring layer during a manufacturing process in order to determine the capacitance value of said compensation capacitor, and the control option unit is operable to determine the capacitance value based on a selection by an external control signal.

9. The semiconductor leakage current detector according to claim 2, wherein in the first comparison, said first and second analog switches are turned on, and a stray capacitor connected to a line for the current to be measured and said integral capacitor are simultaneously charged with the reference current.

10. The semiconductor leakage current detector according to claim 2, wherein said integral capacitor is an accumulation-type MOS capacitor.

11. The semiconductor leakage current detector according to claim 2, wherein said integral capacitor is an accumulation-type P-channel MOS capacitor.

12. The semiconductor leakage current detector according to claim 2, further comprising at least one of a damping capacitor and a damping resistance element, at least one of said damping capacitor and damping resistance being connected to between an input line and a ground line for the reference voltage of said comparison unit.

13. The semiconductor leakage current detector according to claim 2, further comprising a current mirror circuit which outputs the reference current, wherein an output of said current mirror circuit is connected to said first analog switch, and an input of said current mirror circuit is connected to an external pad.

14. The semiconductor leakage current detector according to claim 2, further comprising a current mirror circuit which outputs the reference current, wherein an output of said current mirror circuit is connected to said first analog switch, and an input of said current mirror circuit is connected to a current source.

15. The semiconductor leakage current detector according to claim 13,
wherein said current mirror circuit includes a supply voltage step-down unit, a current mirror connection transistor unit, a third analog switch, and a fourth analog switch,
a supply voltage is supplied to said current mirror connection transistor unit via said supply voltage step-down unit,
an output of said current mirror connection transistor unit is connected to said first analog switch,
an input of said current mirror connection transistor unit is connected to the external pad via said third analog switch, and is connected to a power supply via said fourth analog switch, and
said third and fourth analog switches are exclusively turned on by a shutdown control signal.

16. The semiconductor leakage current detector according to claim 15,
wherein said current mirror connection transistor unit includes a pair of transistors having a single stage current mirror connection.

17. The semiconductor leakage current detector according to claim 2, further comprising:
a timer which measures an elapsed time after the discharge of said integral capacitor;
a memory for storing the predetermined time; and
a control unit operable to control the first and second comparisons,
wherein said control unit is operable to store, into said memory, the elapsed time as the predetermined time, when the output of said comparison unit is inverted in the first comparison, and
in the second comparison, it is determined whether or not the current to be measured is greater than the reference current in accordance with the output of the comparison unit, when the elapsed time reaches the predetermined time stored in said memory.

18. The semiconductor leakage current detector according to claim 17, further comprising
a reference voltage source which generates the reference voltage.

19. The semiconductor leakage current detector according to claim 17, further comprising:
a reference register which holds trimming data;
a reference voltage source which generates a constant voltage in accordance with the trimming data;
a first voltage divider circuit which divides the constant voltage and outputs, as the reference voltage, the divided constant voltage to said comparison unit; and
an analog multiplexer which connects one of said integral capacitor and an external pad to an integration voltage input of said comparison unit,
wherein said control unit is operable to control said comparison unit so as to compare the reference voltage with a signal inputted via said analog multiplexer from the external pad, and to update the trimming data in said reference register based on the comparison result.

20. The semiconductor leakage current detector according to claim 19, further comprising
a second voltage divider circuit which is inserted between the external pad and said analog multiplexer, and has the same layout structure as said first voltage divider circuit.

21. The semiconductor leakage current detector according to claim 19,
wherein said analog multiplexer is an analog switch inserted between the external pad and the integration voltage input of said comparison unit.

22. The semiconductor leakage current detector according to claim 19, further comprising
an inversion analog multiplexer which switches two inputs of said comparison unit,
wherein said control unit is operable to control said comparison unit so as to compare the reference voltage with the signal inputted via said analog multiplexer from the external pad, before and after the two inputs of said comparison unit are switched by said inversion analog multiplexer, and to update the trimming data in said reference register based on the comparison results.

23. The semiconductor leakage current detector according to claim 1,
wherein the current to be measured is a current which flows in a line connected to a source of a memory cell transistor.

24. The semiconductor integrated circuit comprising
a semiconductor leakage current detector which determines whether or not a current to be measured is greater than a reference current,
wherein said semiconductor leakage current detector includes:
a first analog switch which causes the current to be measured to flow or to be cut off;
a second analog switch which causes the reference current to flow or to be cut off;
an integral capacitor which is connected to said first analog switch and said second analog switch, and is charged with the current to be measured or the reference current;
a discharge unit operable to discharge said integral capacitor; and
a comparison unit operable to compare a reference voltage with each of: an integral voltage generated in said integral capacitor by the reference current after the discharge of said integral capacitor; and an integral voltage generated in said integral capacitor by the current to be measured after the discharge of said integral capacitor,
wherein said comparison unit is operable to perform
a first comparison of comparing the reference voltage with the integral voltage generated in said integral capacitor by the reference current after the discharge of said integral capacitor, and
a second comparison of comparing the reference voltage with the integral voltage generated in said integral capacitor by the current to be measured after the discharge of said integral capacitor, and
said semiconductor leakage current detector is operable to determine whether or not the current to be measured is greater than the reference current, based on outputs of said comparison unit as results of the first and second comparisons.

25. The semiconductor integrated circuit according to claim 24, further comprising:
an external analog input/output pad;
a reference voltage source which generates the reference voltage; and
an analog multiplexer which connects one of internal signal lines of said semiconductor integrated circuit exclusively to said external analog input/output pad,
wherein the internal signal lines include at least one of a reference voltage line from said reference voltage source, a current line to be measured for the current to be measured, a reference current line from said semiconductor leakage current detector, and an other signal line.

26. The semiconductor integrated circuit according to claim 24, further comprising:
a timer which measures an elapsed time after the discharge of said integral capacitor;
a memory for storing the predetermined time; and
a control unit operable to control the first and second comparisons,
wherein said control unit is operable to store, into said memory, the elapsed time as the predetermined time, when the output of said comparison unit is inverted in the first comparison, and
in the second comparison, it is determined whether or not the current to be measured is. greater than the reference current in accordance with the output of the comparison unit, when the elapsed time reaches the predetermined time stored in said memory.

27. The semiconductor integrated circuit according to claim 26,
wherein said control unit includes a CPU, and a clock generation circuit, and
said memory stores a program code and data of the CPU, and a crock generation circuit.

28. The semiconductor integrated circuit according to claim 26, comprising:
a reference voltage source which generates a constant voltage in accordance with voltage data;
a voltage divider circuit which divides the constant voltage and outputs, as the reference voltage, the divided constant voltage to said comparison unit;
an oscillator which oscillates a operation clock signal; and
a holding unit operable to hold setting data for trimming,
wherein said holding unit includes one of a first register for holding the voltage data for setting a voltage of said reference voltage source, a second register for holding data for setting a division ratio of said voltage divider circuit, a third register for holding data for setting a capacitance value of said integral capacitor, a fourth register for holding data for setting a bit-length of said timer, and a fifth register for holding data for setting an oscillation frequency of said oscillator, and
said control unit is operable to update the setting data in said holding unit so as to correspond to the current to be measured.

29. The semiconductor integrated circuit further comprising:
a reference register which holds trimming data;
a reference voltage source which generates a constant voltage in accordance with the trimming data;
a first voltage divider circuit which divides the constant voltage and outputs, as the reference voltage, the divided constant voltage to said comparison unit; and
an analog multiplexer which connects one of said integral capacitor and an external pad to an integration voltage input of said comparison unit,
wherein said control unit is operable to control said comparison unit so as to compare the reference voltage with a signal inputted via said analog multiplexer from the external pad, and to update the trimming data in said reference register based on the comparison result.

30. The semiconductor integrated circuit according to claim 29, further comprising:
a second voltage divider circuit which is inserted between the external pad and said analog multiplexer, and has the same layout structure as said first voltage divider circuit.

31. The semiconductor integrated circuit according to claim 29,
wherein said analog multiplexer includes an analog switch which is inserted between the external pad and a wiring which connects said integral capacitor with an integration voltage input of said comparison unit.

32. The semiconductor integrated circuit according to claim 29, further comprising
an inversion analog multiplexer which switches two inputs of said comparison unit,
wherein said control unit is operable to control said comparison unit so as to compare the reference voltage with the signal inputted via said analog multiplexer from the external pad, before and after the two inputs of said comparison unit are switched by said inversion analog multiplexer, and to update the trimming data in said reference register based on the comparison results.

33. The semiconductor integrated circuit according to claim 29, further comprising
a voltage follower which is inserted between said reference voltage source and said first voltage divider circuit;
a bypass wiring which bypasses said voltage follower; and
a switch circuit which selects one of said voltage follower and the bypass wiring,
wherein said switch circuit selects said voltage follower at least in the first and second comparisons.

34. The semiconductor integrated circuit according to claim 24,
wherein the current to be measured is a current which flows in a line connected to a source of a memory cell transistor.

35. A leakage current measurement method for use in a semiconductor integrated circuit,
wherein the semiconductor circuit includes:
a first analog switch which causes the current to be measured to flow or to be cut off;
a second analog switch which causes the reference current to flow or to be cut off;
an integral capacitor which is connected to the first analog switch and the second analog switch, and is charged with the current to be measured or the reference current;
a discharge unit operable to discharge the integral capacitor; and
a comparator operable to compare a reference voltage with each of: an integral voltage generated in the integral capacitor by the reference current after the discharge of the integral capacitor; and an integral voltage generated in the integral capacitor by the current to be measured after the discharge of the integral capacitor,
said leakage current measurement method comprising:
a calibration step of comparing the reference voltage with the integral voltage generated in the integral capacitor by the reference current after the discharge of the integral capacitor;
a test step of comparing the reference voltage with the integral voltage generated in the integral capacitor by the current to be measured after the discharge of the integral capacitor; and
a determination step of determining whether or not the current to be measured is greater than the reference current, based on results obtained in said calibration step and said test step.

36. The leakage current measurement method according to claim 35,
wherein in said calibration step, a time required for the output of the comparator to be inverted after the discharge of the integral capacitor is measured, in said test step, a comparison result obtained by the comparator is checked when the time passes after the discharge of the integral capacitor, and in said determination step, it is determined whether or not the integral voltage is greater than the reference voltage, based on whether or not the comparison result is inverted in said test step.

37. The semiconductor leakage current measurement method according to claim 35, wherein a predetermined time is equivalent to n-times as long as the time which is ranged from after the discharge of the integral capacitor until the inversion of the output of the comparator in said calibration step, and in said determination step, it is determined that the current to be measured is greater than 1/n of the reference current in the case where the output of the comparator is inverted when the predetermined time passes after the discharge of the integral capacitor.

38. The leakage current measurement method according to claim 36, wherein the semiconductor integrated circuit further includes a current mirror circuit which outputs the reference current, an output of the current mirror circuit is connected to the first analog switch, and an input of the current mirror circuit is connected to an external pad, and said leakage current measurement method further comprising:

a reference current apply step of applying a reference current from an external pad; and a reference current stabilization step of keeping an operation in said calibration step on standby until the reference current is stabilized as a constant current by charging a parasitic capacitor of the external pad with the reference current.

39. The leakage current measurement method according to claim 36, wherein said calibration step includes an initialization step, a start step, a read-out loop, and a storage step that are sequentially executed, in said initialization step, the timer is initialized and the integral capacitor is discharged, in said start step, counting of the timer and charging of the integral capacitor with the reference current are started, in said read-out loop, the comparator is periodically read out during the counting of the timer and the charging of the integral capacitor, and the counting of the timer and said read-out loop is stopped, when the comparator indicates that the integral voltage is greater than the reference voltage, in said storage step, a count value counted by the timer is stored when said read-out loop is stopped, wherein said test step includes a capacitor initialization step, a timer start step, a countdown loop, and a determination step that are sequentially executed, in said capacitor initialization step, loading of the count value into the timer stored in said storage step and discharging of the integral capacitor are executed, in said timer start step, counting-down of the timer and charging of the integral capacitor are started, in said countdown loop, the counting down of the timer and the charging of the integral capacitor are executed, and said countdown loop is stopped when a countdown value counted by the timer reaches a predetermined value, and in said determination step, a test for determining whether or not the current to be measured is greater than the reference current is executed.

40. A reference voltage trimming method for use in the semiconductor integrated circuit, wherein the semiconductor integrated circuit includes a semiconductor leakage current detector which determines whether or not a current to be measured is greater than a reference current, the semiconductor leakage current detector has:

a first analog switch which causes the current to be measured to flow or to be cut off;

a second analog switch which causes the reference current to flow or to be cut off;

an integral capacitor which is connected to the first analog switch and the second analog switch, and is charged with the current to be measured or the reference current;

a discharge unit operable to discharge the integral capacitor; and a comparison unit operable to compare a reference voltage with each of: an integral voltage generated in the integral capacitor by the reference current after the discharge of the integral capacitor; and an integral voltage generated in the integral capacitor by the current to be measured after the discharge of the integral capacitor, the comparison unit is operable to perform a first comparison of comparing the reference voltage with the integral voltage generated in the integral capacitor by the reference current after the discharge of the integral capacitor, and a second comparison of comparing the reference voltage with the integral voltage generated in the integral capacitor by the current to be measured after the discharge of the integral capacitor, and the semiconductor leakage current detector is operable to determine whether or not the current to be measured is greater than the reference current, based on outputs of the comparison unit as results of the first and second comparisons, the semiconductor integrated circuit further has:

a timer which measures an elapsed time after the discharge of the integral capacitor;

a memory for storing the predetermined time; and a control unit operable to control the first and second comparisons, the control unit is operable to store, into the memory, the elapsed time as the predetermined time, when the output of the comparison unit is inverted in the first comparison, and in the second comparison, it is determined whether or not the current to be measured is greater than the reference current in accordance with the output of the comparison unit, when the elapsed time reaches the predetermined time stored in the memory, the semiconductor integrated circuit further has:

a reference register which holds trimming data;

a reference voltage source which generates a constant voltage in accordance with the trimming data;

a first voltage divider circuit which divides the constant voltage and outputs, as the reference voltage, the divided constant voltage to the comparison unit; and an analog multiplexer which connects one of the integral capacitor and an external pad to an integration voltage input of the comparison unit, and the control unit is operable to control the comparison unit so as to compare the reference voltage with a signal inputted via the analog multiplexer from the external pad, and to update the trimming data in the reference register based on the comparison result, said method comprising a target voltage apply step, a first intermediate value search step, a comparator input inversion step, a second intermediate value search step, and a trimming value average step that are sequentially executed, wherein in said target voltage apply step, the reference voltage is applied, in said first intermediate value search step, a first trimming intermediate value is obtained, the first trimming intermediate value being a boundary value at which an output of the comparator is inverted, in said comparator input inversion step, inputs of the comparator are switched by the inversion analog multiplexer, in said second intermediate value search step, a second trimming intermediate value is obtained, the second trimming intermediate value being a boundary value at which an output of the comparator is inverted, and in a trimming average step, a trimming value is obtained by taking an average between the first trimming intermediate value and the second trimming intermediate value, as a trimming result of the reference voltage.

41. The reference voltage trimming method according to claim 40, wherein said first intermediate value search step includes a trimming initial value setting step, a comparator read-out step, and a trimming loop that are sequentially executed, in said trimming initial value setting step, an initial value is set to the reference voltage register which controls an output level of the reference voltage, in said comparator read-out step, the comparator is read out and whether or not an external voltage which is proportional to a voltage of the external pad is greater than the reference voltage is read out, in said trimming loop, the trimming data in the reference voltage register is moved one step down to a high voltage in the case where the external voltage is smaller than the reference voltage and the comparator is repeatedly read out until the external voltage becomes greater than the reference voltage, and in the case where the external voltage is greater than the reference voltage, the reference voltage register is moved one step up and the comparator is repeatedly read out until the external voltage becomes smaller than the reference voltage, and in said second intermediate value search step, the same processes as in said first intermediate value search step are performed except the following processes of: setting the first trimming intermediate value to the reference voltage register in said trimming initial value setting step; and outputting the second trimming intermediate value in said trimming loop.

* * * * *